(12) United States Patent
Shang et al.

(10) Patent No.: US 11,170,682 B2
(45) Date of Patent: Nov. 9, 2021

(54) SHIFT REGISTER AND DRIVING METHOD THEREOF, GATE DRIVING CIRCUIT AND DISPLAY DEVICE

(71) Applicant: BOE Technology Group Co., Ltd., Beijing (CN)

(72) Inventors: Guangliang Shang, Beijing (CN); Libin Liu, Beijing (CN); Can Zheng, Beijing (CN); Yipeng Chen, Beijing (CN); Xinshe Yin, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/651,816

(22) PCT Filed: Mar. 25, 2019

(86) PCT No.: PCT/CN2019/079589
§ 371 (c)(1),
(2) Date: Jul. 20, 2020

(87) PCT Pub. No.: WO2020/191597
PCT Pub. Date: Oct. 1, 2020

(65) Prior Publication Data
US 2021/0020090 A1  Jan. 21, 2021

(51) Int. Cl.
*G09G 3/20* (2006.01)
*G11C 19/28* (2006.01)

(52) U.S. Cl.
CPC ............ *G09G 3/20* (2013.01); *G11C 19/28* (2013.01); *G09G 2300/0426* (2013.01);
(Continued)

(58) Field of Classification Search
CPC ............ G09G 3/3266; G09G 3/3674; G09G 2310/0267; G09G 2310/0286; G09G 3/20;
(Continued)

(56) References Cited

U.S. PATENT DOCUMENTS 10,467,938 B1 * 11/2019 Xiang .................. G09G 3/3266
2014/0375616 A1 * 12/2014 Kim ..................... G09G 3/3266
345/211

(Continued)

*Primary Examiner* — Stephen G Sherman
*Assistant Examiner* — Aaron Midkiff
(74) *Attorney, Agent, or Firm* — Arent Fox LLP; Michael Fainberg

(57) ABSTRACT

Provided are a shift register and a driving method thereof, a gate driving circuit, and a display device. The shift register includes: an input circuit, configured to be coupled to an input signal end and a second clock signal end, respectively; a first transistor, where the first electrode of the first transistor is coupled to the output end of the input circuit, and the first transistor is a double-gate type transistor; the first gate of the first transistor is configured to be coupled to a first reference signal end, and the second gate of the first transistor is configured to be coupled to a first threshold control signal end; and an output circuit, configured to be coupled to a first clock signal end and a signal output end, respectively, where the control end of the output circuit is coupled to the second electrode of the first transistor.

15 Claims, 20 Drawing Sheets

(52) U.S. Cl.
CPC . *G09G 2300/08* (2013.01); *G09G 2310/0267* (2013.01); *G09G 2310/0286* (2013.01); *G09G 2310/08* (2013.01)

(58) Field of Classification Search
CPC ... G09G 2300/0408; G09G 2300/0426; G09G 2300/08; G09G 2320/0214; G09G 2310/08; G11C 19/28; H01L 29/66484; H01L 29/7831; H01L 29/78645; H01L 29/78648; H01L 29/8124
USPC ............ 345/100, 204, 205; 377/64–81
See application file for complete search history.

(56) References Cited

U.S. PATENT DOCUMENTS

| | | | |
|---|---|---|---|
| 2017/0084222 A1* | 3/2017 | Sun | G09G 3/32 |
| 2017/0125122 A1* | 5/2017 | Miyake | H01L 27/1255 |
| 2017/0287388 A1* | 10/2017 | Ma | G11C 19/28 |
| 2017/0287393 A1* | 10/2017 | Ma | G09G 3/3266 |
| 2017/0287404 A1* | 10/2017 | Kim | G09G 3/3266 |

* cited by examiner

SHIFT REGISTER AND DRIVING METHOD THEREOF, GATE DRIVING CIRCUIT AND DISPLAY DEVICE This application is a National Stage of International Application No. PCT/CN2019/079589, filed Mar. 25, 2019, which is hereby incorporated by reference in its entirety.

FIELD

The present disclosure relates to the field of displaying, and particularly to a shift register and a driving method thereof, a gate driving circuit, and a display device.

BACKGROUND

With the rapid development of display technologies, display devices are increasingly developed toward high integration and low cost. A GOA (Gate Driver on Array) technology integrates a TFT (Thin Film Transistor) gate driving circuit on an array substrate of a display device to perform scanning driving on the display device. The gate driving circuit is generally composed of a plurality of cascaded shift registers. However, outputs of the shift registers are unstable, which would cause a display abnormality.

SUMMARY

The embodiment of the present disclosure provides a shift register, including: an input circuit, configured to be coupled to an input signal end and a second clock signal end, respectively; a first transistor, where a first electrode of the first transistor is coupled to an output end of the input circuit, and the first transistor is a double-gate type transistor; a first gate of the first transistor is configured to be coupled to a first reference signal end, and a second gate of the first transistor is configured to be coupled to a first threshold control signal end; and an output circuit, configured to be coupled to a first clock signal end and a signal output end, respectively, where a control end of the output circuit is coupled to a second electrode of the first transistor.

Optionally, in the embodiment of the present disclosure, the input circuit includes: a single-gate second transistor.

A gate of the second transistor is configured to be coupled to the second clock signal end. A first electrode of the second transistor is configured to be coupled to the input signal end. A second electrode of the second transistor is coupled to the first electrode of the first transistor.

Optionally, in the embodiment of the present disclosure, the second gate of the first transistor is coupled to the gate of the second transistor; or, the second gate of the first transistor is coupled to the first electrode of the second transistor.

Optionally, in the embodiment of the present disclosure, the input circuit includes: a double-gate type second transistor. A first gate of the second transistor is configured to be coupled to the second clock signal end, and a second gate of the second transistor is configured to be coupled to a second threshold control signal end. A first electrode of the second transistor is configured to be coupled to the input signal end, and a second electrode of the second transistor is coupled to the first electrode of the first transistor.

Optionally, in the embodiment of the present disclosure, the second gate of the second transistor is coupled to the first gate of the second transistor; or, the second gate of the second transistor is coupled to the first electrode of the second transistor.

Optionally, in the embodiment of the present disclosure, the second gate of the first transistor is coupled to the first gate of the second transistor; or, the second gate of the first transistor is coupled to the first electrode of the second transistor.

Optionally, in the embodiment of the present disclosure, the shift register further includes: a fifth transistor, a sixth transistor, a seventh transistor, and a first capacitor.

A gate of the fifth transistor is configured to be coupled to the second clock signal end. A first electrode of the fifth transistor is configured to be coupled to the first reference signal end. A second electrode of the fifth transistor is coupled to a gate of the seventh transistor.

A gate of the sixth transistor is configured to be coupled to the first electrode of the first transistor. A first electrode of the sixth transistor is configured to be coupled to the second clock signal end. A second electrode of the sixth transistor is coupled to the gate of the seventh transistor.

A first electrode of the seventh transistor is configured to be coupled to the second reference signal end, and a second electrode of the seventh transistor is coupled to the signal output end.

A first end of the first capacitor is coupled to the gate of the seventh transistor, and a second end of the first capacitor is configured to be coupled to the second reference signal end.

Optionally, in the embodiment of the present disclosure, the shift register further includes: a pull-up control circuit. A first control end of the pull-up control circuit is configured to be coupled to the first clock signal end. A second control end of the pull-up control circuit is coupled to the gate of the seventh transistor. An input end of the pull-up control circuit is configured to be coupled to the second reference signal end. An output end of the pull-up control circuit is coupled to the first electrode of the first transistor.

Optionally, in the embodiment of the present disclosure, the pull-up control circuit includes: a third transistor and a single-gate type fourth transistor.

A gate of the third transistor is configured to be coupled to the first clock signal end. A first electrode of the third transistor is coupled to the first electrode of the first transistor. A second electrode of the third transistor is coupled to a first electrode of the fourth transistor.

A gate of the fourth transistor is coupled to the gate of the seventh transistor, and a second electrode of the fourth transistor is configured to be coupled to the second reference signal end.

Optionally, in the embodiment of the present disclosure, the pull-up control circuit includes: a third transistor and a double-gate type fourth transistor.

A gate of the third transistor is configured to be coupled to the first clock signal end. A first electrode of the third transistor is coupled to the first electrode of the first transistor. A second electrode of the third transistor is coupled to a first electrode of the fourth transistor.

A first gate of the fourth transistor is coupled to the gate of the seventh transistor. A second gate of the fourth transistor is configured to be coupled to a third threshold control signal end. A second electrode of the fourth transistor is configured to be coupled to the second reference signal end.

Optionally, in the embodiment of the present disclosure, the second gate of the fourth transistor is coupled to the gate of the seventh transistor; or, the second gate of the fourth transistor is coupled to the gate of the fifth transistor.

Optionally, in the embodiment of the present disclosure, the output circuit includes: an eighth transistor and a second capacitor.

A gate of the eighth transistor is configured to be coupled to the second electrode of the first transistor. A first electrode of the eighth transistor is configured to be coupled to the first clock signal end. A second electrode of the eighth transistor is coupled to the signal output end.

A first end of the second capacitor is coupled to the second electrode of the first transistor, and a second end of the second capacitor is configured to be coupled to the signal output end.

Optionally, in the embodiment of the present disclosure, the first threshold control signal end is configured to receive a signal at least having a level opposite to a level of the signal of the first reference signal end.

The second threshold control signal end is configured to receive the signal at least having a level opposite to a level of the signal of the first reference signal end.

The third threshold control signal end is configured to receive the signal at least having a level opposite to a level of the signal of the first reference signal end.

Optionally, in the embodiment of the present disclosure, at least one of the first threshold control signal end, the second threshold control signal end, and the third threshold control signal end is configured to receive a clock signal which is the same as a time sequence of the second clock signal end.

Optionally, in the embodiment of the present disclosure, at least one of the first threshold control signal end, the second threshold control signal end, and the third threshold control signal end is configured to receive a fixed voltage signal.

Correspondingly, the embodiment of the present disclosure further provides a gate driving circuit, including a plurality of the above shift registers that are cascaded.

An input signal terminal of a first stage of shift register is configured to be coupled to a frame trigger signal end.

In every two adjacent shift registers, an input signal end of a next stage of shift register is configured to be coupled to a signal output end of a previous stage of shift register.

Correspondingly, the embodiment of the present disclosure further provides a display device, including the above-mentioned gate driving circuit.

Correspondingly, the embodiment of the present disclosure further provides a driving method of the above-mentioned shift register, including: at an input phase, controlling, by the input circuit, a level of a signal of the first electrode of the first transistor according to signals of the input signal end and the second clock signal end, switching on the first transistor, and providing, by the output circuit in response to a signal of the second electrode of the first transistor, a signal of the first clock signal end to the signal output end; at an output phase, enabling a threshold voltage of the first transistor to move in response to a signal of the first threshold control signal end, switching off the first transistor, and providing, by the output circuit in response to the signal of the second electrode of the first transistor, the signal of the first clock signal end to the signal output end, where a level of a signal of the first threshold control signal end is opposite to a level of a signal of the first reference signal end.

Optionally, in the embodiment of the present disclosure, the input phase further includes: providing, by the fifth transistor in response to the signal of the second clock signal end, the signal of the first reference signal end to a gate of a seventh transistor; providing, by a sixth transistor in response to the signal of the first electrode of the first transistor, the signal of the second clock signal end to the gate of the seventh transistor; and providing, by the seventh transistor in response to a signal of the gate of the seventh transistor, the signal of the second reference signal end to the signal output end.

After the output phase, the driving method further includes: at a reset phase, controlling, by the input circuit, the level of the signal of the first electrode of the first transistor according to the signals of the input signal end and the second clock signal end; switching on, by the first transistor, the input circuit and the output circuit; providing, by the fifth transistor in response to the signal of the second clock signal end, the signal of the first reference signal end to the gate of the seventh transistor; and providing, by a seventh transistor in response to the signal of the gate of the seventh transistor, the signal of the second reference signal end to the signal output end.

Optionally, in the embodiment of the present disclosure, at the output phase, a threshold voltage of the second transistor moves in response to a signal of a second threshold control signal end, and the second transistor is switched off; and a threshold voltage of a fourth transistor moves in response to a signal of a third threshold control signal end, and the fourth transistor is switched off.

DETAILED DESCRIPTION OF THE EMBODIMENTS

Figure 1:
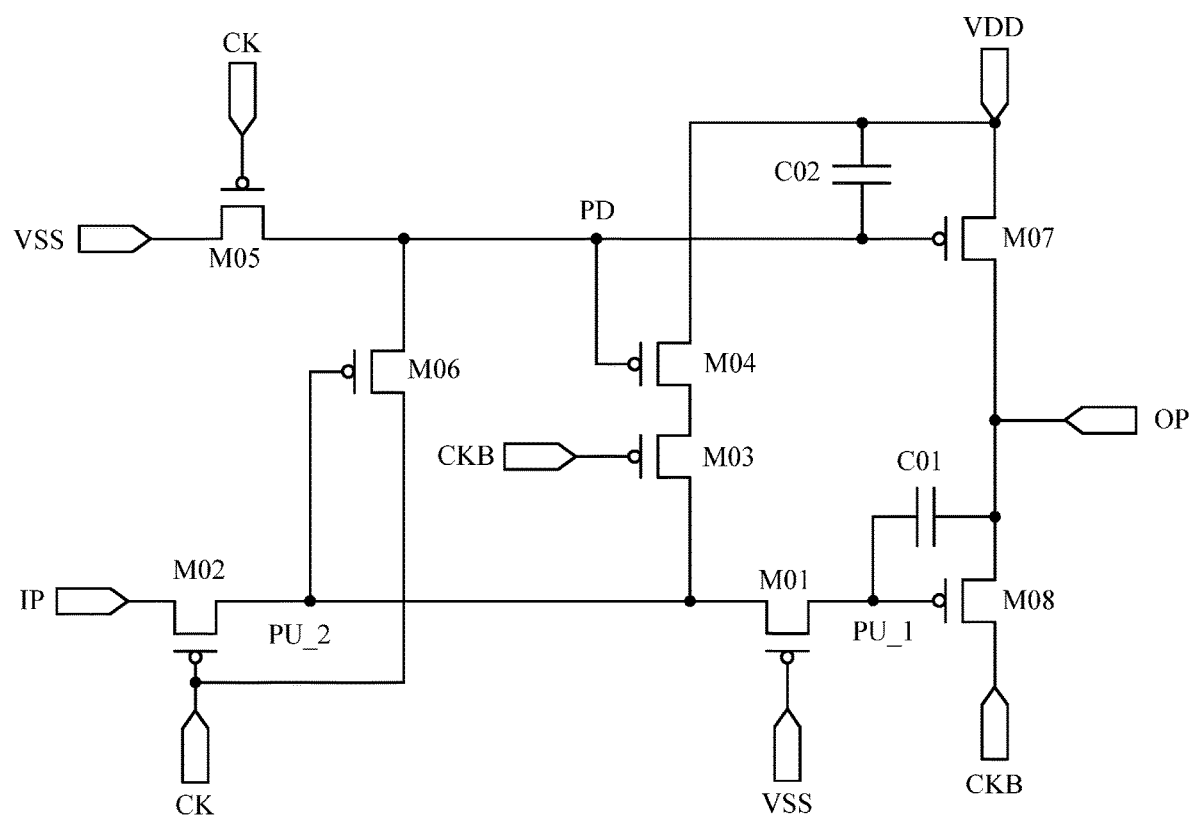
FIG. 1 is a schematic structural diagram of a shift register in the related art.

In order to make the objectives, technical solutions and advantages of the present disclosure clearer, specific implementation modes of a shift register and a driving method thereof, a gate driving circuit, and a display device which are provided by the embodiments of the present disclosure are described below in detail with reference to the accompanying drawings. It should be understood that the preferred embodiments described below are merely to illustrate and explain the present disclosure, and not intended to limit the present disclosure. Furthermore, the embodiments in the present disclosure and features in the embodiments may be combined with each other without conflicts. It should be noted that the sizes and shapes of all patterns in the drawings do not reflect real scales, and are merely to illustrate the contents of the present disclosure. Furthermore, same or similar numerals throughout indicate same or similar elements or elements with same or similar functions.

Figure 2:
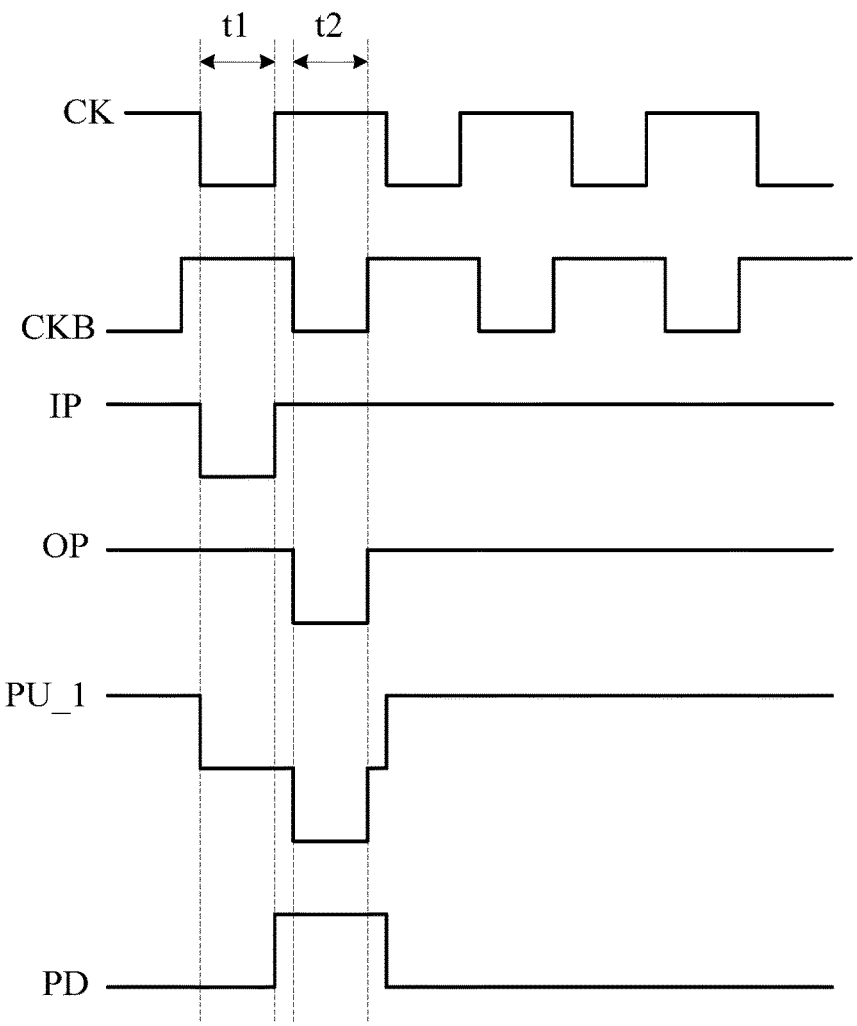
FIG. 2 is a signal time sequence diagram of the shift register shown in FIG. 1.

As shown in FIG. 1, a shift register may include transistors M01 to M08, and capacitors C01 to C02. A signal time sequence diagram corresponding to the shift register shown in FIG. 1 is as shown in FIG. 2.

At an input phase t1, the transistor M02 and the transistor M05 are switched on under the control of the signal of a clock signal end CK. The switched-on transistor M05 provides a low-level signal of a signal end VSS to a pull-down node PD to enable the signal of the pull-down node PD to be the low-level signal, so as to control the transistor M04 and the transistor M07 to be switched on. Furthermore, the transistor M03 is switched off under the control of the signal of a clock signal end CKB. The switched-on transistor M07 provides a high-level signal of a signal end VDD to a signal output end OP to enable the signal output end OP to output the high-level signal. Furthermore, the switched-on transistor M02 provides a low-level signal of an input signal end IP to a second pull-up node PU_2 to enable the signal of the second pull-up node PU_2 to be the low-level signal. The transistor M06 is switched on under the control of the signal of the second pull-up node PU_2, so as to provide the low-level signal of the clock signal end CK to the pull-down node PD. Since the transistor M01 satisfies $V_{gs01} < V_{th01}$, so that the transistor M01 is switched on. At this time, an electrode, connected with a first pull-up node PU_1, of the transistor M01 is used as a source. $V_{gs01}$ represents a voltage difference between the gate and the source of the transistor M01, and $V_{th01}$ represents a threshold voltage of the transistor M01. The switched-on transistor M01 switches on the second pull-up node PU_2 and the first pull-up node PU_1, thereby enabling the signal of the first pull-up node PU_1 to be the low-level signal to control the transistor M08 to be switched on. The switched-on transistor M08 provides the high-level signal of the clock signal end CKB to the signal output end OP to enable the signal output end OP to output the high-level signal.

It should be noted that in actual application, the voltage of the low-level signal of the first pull-up node PU_1 may be the same as the voltage of the signal of the signal end VSS. Due to the reason of the threshold voltage of the transistor M01, the voltage of the low-level signal of the first pull-up node PU_1 may be less than the voltage of the low-level signal of the second pull-up node PU_2. Of course, specific voltages may be designed and determined according to an actual application environment, and are not limited here.

After the input phase t1, and before an output phase t2, the transistor M02 and the transistor M05 are switched off under the control of the high-level signal of the clock signal end CK, and the transistor M03 is also switched off under the control of the high-level signal of the clock signal end CKB. The first pull-up node PU_1 is kept at the low-level signal under the action of the capacitor C01. Generally, an electrode with relatively high voltage may be used as the source of a transistor. Therefore, at this phase, the electrode, electrically connected to the second pull-up node PU_2, of the transistor M01 is used as the source of the transistor M01, so that the transistor M01 may satisfy $V_{gs01} < V_{th01}$. Therefore, the transistor M01 is switched on, so that the signal of the second pull-up node PU_2 is the low-level signal. The transistor M06 is switched on under the control of the signal of the second pull-up node PU_2 to provide the high-level signal of the clock signal end CKB to the pull-down node PD, so as to enable the signal of the pull-down node PD to be the high-level signal to control the transistor M04 and the transistor M07 to be switched off. The transistor M08 is switched on under the control of the signal of the first pull-up node PU_1 to provide the high-level signal of the clock signal end CKB to the signal output end OP to enable the signal output end OP to output the high-level signal.

At the output phase t2, the transistor M02 and the transistor M05 are switched off under the control of the high-level signal of the clock signal end CK, and the first pull-up node PU_1 is kept at the low-level signal under the action of the capacitor C01 to control the transistor M08 to be switched on, thereby providing the low-level signal of the clock signal end CKB to the signal output end OP. Under the action of the capacitor C01, the level of the first pull-up node PU_1 is further pulled down to control the transistor M08 to be completely switched on as much as possible to provide the low-level signal of the clock signal end CKB to the signal output end OP, so that the signal output end OP outputs the low-level signal.

However, at the output phase t2, the transistor M01 undergoes long-time accumulation of leakage, which causes a phenomenon of leakage of the level of the first pull-up node PU_1 that is further pulled down and causes the level of the first pull-up node PU_1 to rise, so that the transistor M08 may not be switched on completely, leading to an abnormality in the signal output by the signal output end OP. Particularly under a driving condition of the display device using a relatively low refresh frequency (such as 1 Hz), the transistors M01, M02, and M04 undergo the long-term accumulation of leakage, so that the levels of PU_2 and PU_1 would rise, leading to the abnormality in the signal output by the signal output end OP.

Figure 3A:
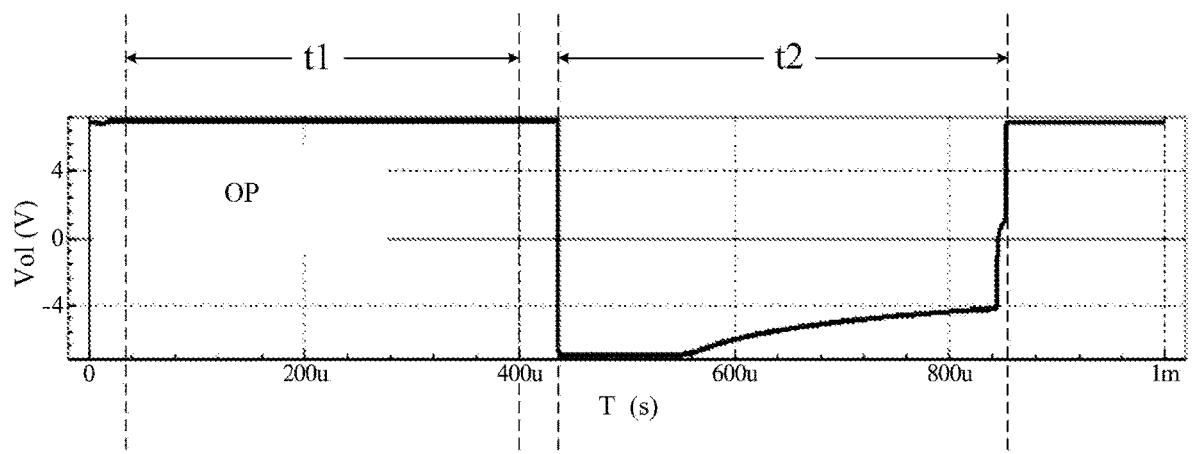
FIG. 3A is a simulation diagram corresponding to the signal output end of the shift register shown in FIG. 1.
Figure 3B:
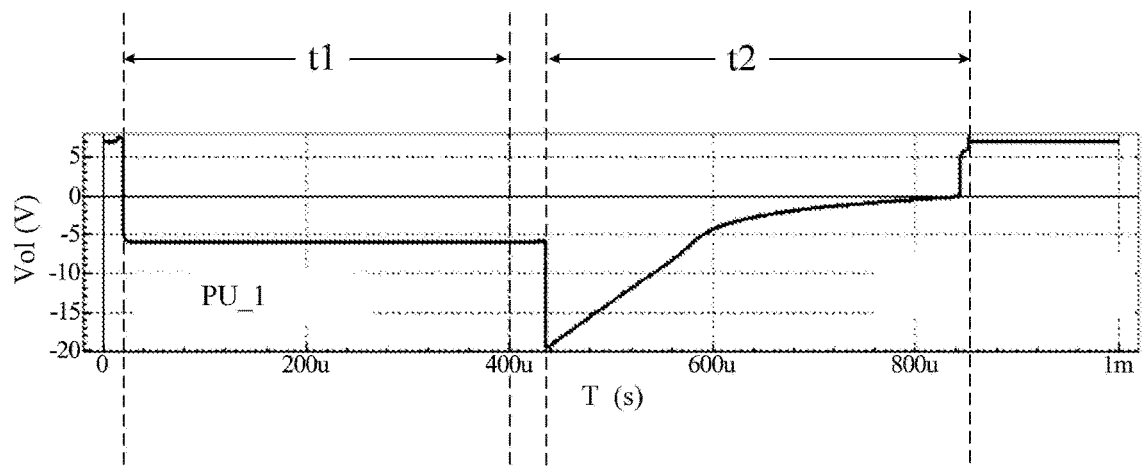
FIG. 3B is a simulation diagram corresponding to a first pull-up node of the shift register shown in FIG. 1.

Furthermore, still according to the signal time sequence diagram shown in FIG. 2, the signal output by the signal output end OP and the signal of the first pull-up node PU_1 of the shift register are simulated, as shown in FIG. 3A and FIG. 3B. FIG. 3A is a simulation diagram of the signal output by the signal output end OP of the shift register shown in FIG. 1 under the control of the signal shown in FIG. 2. FIG. 3B is a simulation diagram of the signal output by the first pull-up node PU_1 of the shift register shown in FIG. 1 under the control of the signal shown in FIG. 2. The X-coordinate represents time, and the Y-coordinate represents voltage. It can be known in combination with FIG. 3A and FIG. 3B that at the output phase t2, the leakage of the level of the first pull-up node PU_1 causes the level of the first pull-up node PU_1 to rise, so that the level of the signal output by the signal output end OP also rises, thus leading to the abnormality in the signal output by the signal output end OP. Furthermore, due to the influence of the leakage, the above shift register is not conductive to being configured in the low-frequency (such as 1 Hz) driven display device.

Figure 4A:
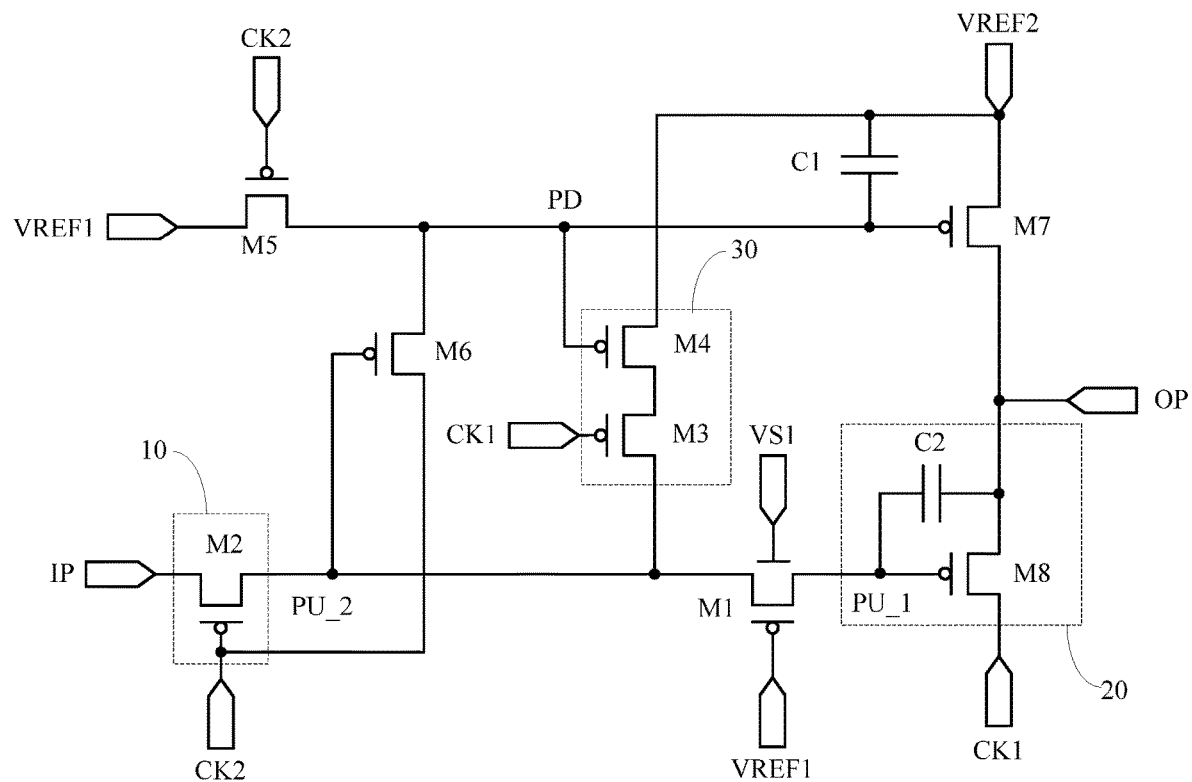
FIG. 4A is a schematic structural diagram I of a shift register provided by the embodiment of the present disclosure.

Based on this, the embodiment of the present disclosure provides some shift registers, as shown in FIG. 4A. The register includes an input circuit 10, a first transistor M1 and an output circuit 20.

The input circuit 10 is configured to be coupled to an input signal end IP and a second clock signal end CK2, respectively.

A first electrode of the first transistor M1 is coupled to an output end of the input circuit 10. The first transistor M1 is a double-gate type transistor. A first gate of the first transistor M1 is configured to be coupled to a first reference signal end VREF1, and a second gate of the first transistor M1 is configured to be coupled to a first threshold control signal end VS1.

The output circuit 20 is configured to be coupled to a first clock signal end CK1 and a signal output end OP, respectively. A control end of the output circuit 20 is coupled to a second electrode of the first transistor M1.

According to the shift register provided by the embodiment of the present disclosure, the first transistor is set as a double-gate type transistor. The first gate of the first transistor receives the first reference signal end, and the second gate of the first transistor receives the first threshold control signal end, so that the first transistor may be switched on at an input phase, a reset phase, and a reset holding phase. Furthermore, at least at the output phase, the signal of the first threshold control signal end controls a threshold voltage $V_{th1}$ of the first transistor to enable the threshold voltage $V_{th1}$ of the first transistor to move, so as to enable the first transistor to be switched off as much as possible at the output phase, which may keep the level of the signal of the first pull-up node to be stabilized and avoid the influence of leakage on the signal of the first pull-up node. Therefore, the stability of the signal output by the signal output end is improved. Then, the shift register is favorably applied to the low-frequency driven display device, and is conductive to reducing the power consumption.

During specific implementation, as shown in FIG. 4A, the first pull-up node PU_1 is located between the control end of the output circuit 20 and the second electrode of the first transistor M1. The second pull-up node PU_2 is located between the output end of the input circuit 10 and the first electrode of the first transistor M1. It should be noted that the first pull-up node PU_1 and the second pull-up node PU_2 are virtual nodes in the shift register. The two nodes are only to facilitate the description of the structure of the shift register and transmission of signals. The specific structure of the shift register and the transmission of the signals may be determined according to a coupling mode between various transistors and capacitors in the shift register.

During specific implementation, in the embodiment of the present disclosure, as shown in FIG. 4A, the input circuit 10 is configured to control the level of the signal of the second pull-up node PU_2 according to the input signal end IP and the second clock signal end CK2. In this way, the signal of the input signal end IP may be input through the input circuit 10. The output circuit 20 is configured to provide the signal of the first clock signal end CK1 to the signal output end OP in response to the signal of the first pull-up node PU_1. In this way, the signal of the first clock signal end CK1 may be output through the output circuit 20. Furthermore, the second pull-up node PU_2 is coupled to the first pull-up node PU_1 through the first transistor M1.

During specific implementation, in the embodiment of the present disclosure, as shown in FIG. 4A, the first electrode of the first transistor M1 is coupled to the second pull-up node PU_2, and the second electrode of the first transistor M1 is coupled to the first pull-up node PU_1.

Specifically, during specific implementation, the input circuit 10 may include: a single-gate type second transistor M2. The gate of the second transistor M2 is configured to be coupled to the second clock signal end CK2. The first electrode of the second transistor M2 is configured to be coupled to the input signal end IP. The second electrode of the second transistor M2 is coupled to the first electrode of the first transistor M1, that is, the second electrode of the second transistor M2 is coupled to the second pull-up node PU_2. Further, the second transistor M2 in an on state under the control of the signal of the second clock signal end CK2 may provide the signal of the input signal end IP to the first electrode (i.e., the second pull-up node PU_2) of the first transistor M1, so as to control the level of the signal of the first electrode (i.e., the second pull-up node PU_2) of the first transistor M1.

During specific implementation, in the embodiment of the present disclosure, as shown in FIG. 4A, the shift register further includes: a fifth transistor M5, a sixth transistor M6, a seventh transistor M7, and a first capacitor C1.

The gate of the fifth transistor M5 is configured to be coupled to the second clock signal end CK2. The first electrode of the fifth transistor M5 is configured to be coupled to the first reference signal end VREF1. The second electrode of the fifth transistor M5 is coupled to the gate of the seventh transistor M7 (i.e., the pull-down node PD).

The gate of the sixth transistor M6 is coupled to the first electrode (i.e., the second pull-up node PU_2) of the first transistor M1. The first electrode of the sixth transistor M6 is configured to be coupled to the second clock signal end CK2. The second electrode of the sixth transistor M6 is coupled to the gate (i.e., the pull-down node PD) of the seventh transistor M7.

The first electrode of the seventh transistor M7 is configured to be coupled to the second reference signal end VREF2, and the second electrode of the seventh transistor M7 is coupled to the signal output end OP.

The first end of the first capacitor C1 is coupled to the gate (i.e., the pull-down node PD) of the seventh transistor M7, and the second end of the first capacitor C1 is configured to be coupled to the second reference signal end VREF2.

Further, the fifth transistor M5 in an on state under the control of the signal of the second clock signal end CK2 may provide the signal of the first reference signal end VREF1 to the gate (i.e., the pull-down node PD) of the seventh transistor M7. The sixth transistor M6 in an on state under the control of the signal of the first electrode of the first transistor M1 may provide the signal of the second clock signal end CK2 to the gate (i.e., the pull-down node PD) of the seventh transistor M7. The seventh transistor M7 in an on state under the control of the signal of its gate (i.e., the pull-down node PD) may provide the signal of the second reference signal terminal VREF2 to the signal output end OP for coupling. The first capacitor C1 may store the signal input to the gate (i.e., the pull-down node PD) of the seventh transistor M7 and the signal of the second reference signal end VREF2, and keep the signals stable.

During specific implementation, in the embodiment of the present disclosure, as shown in FIG. 4A, the shift register may further include: a pull-up control circuit 30. The first control end of the pull-up control circuit 30 is configured to be coupled to the first clock signal end CK1. The second control end of the pull-up control circuit 30 is coupled to the gate of the seventh transistor M7. The input end of the pull-up control circuit 30 is configured to be coupled to the second reference signal end VREF2. The output end of the pull-up control circuit 30 is coupled to the first electrode of the first transistor M1. The pull-up control circuit 30 is configured to provide the signal of the second reference signal end VREF2 to the first electrode (i.e., the second pull-up node PU_2) of the first transistor M1 in response to the signal of the first clock signal end CK1 and the signal of the gate (i.e., the pull-down node PD) of the seventh transistor M7.

Specifically, during specific implementation, as shown in FIG. 4A, the pull-up control circuit 30 may include: a third transistor M3 and a single-gate type fourth transistor M4. The gate of the third transistor M3 is configured to be coupled to the first clock signal end CK1. The first electrode of the third transistor M3 is coupled to the first electrode (i.e., the second pull-up node PU_2) of the first transistor M1. The second electrode of the third transistor M3 is coupled to the first electrode of the fourth transistor M4. The gate of the fourth transistor M4 is coupled to the gate (i.e., the pull-down node PD) of the seventh transistor M7, and the second electrode of the fourth transistor M4 is configured to be coupled to the second reference signal end VREF2.

Further, the fourth transistor M4 in an on state under the control of the signal of the gate (i.e., the pull-down node PD) of the seventh transistor M7 may provide the signal of the second reference signal terminal VREF2 to the first electrode of the fourth transistor M4. The third transistor M3 in an on state under the control of the signal of the first clock signal end CK1 may switch on the first electrode (i.e., the second pull-up node PU_2) of the first transistor M1 and the first electrode of the fourth transistor M4.

During specific implementation, in the embodiment of the present disclosure, as shown in FIG. 4A, the output circuit 20 may include: an eighth transistor M8 and a second capacitor C2. The gate of the eighth transistor M8 is coupled to the second electrode (i.e., the first pull-up node PU_1) of the first transistor M1. The first electrode of the eighth transistor M8 is coupled to the first clock signal end CK1. The second electrode of the eighth transistor M8 is coupled to the signal output end OP. The first end of the second capacitor C2 is coupled to the second electrode (i.e., the first pull-up node PU_1) of the first transistor M1, and the second end of the second capacitor C2 is coupled to the signal output end OP.

Further, the eighth transistor M8 in an on state under the control of the signal of the second electrode (i.e., the first pull-up node PU_1) of the first transistor M1 may provide the signal of the first clock signal end CK1 to the signal output end OP. The second capacitor C2 may store the signal input to the second electrode (i.e., the first pull-up node PU_1) of the first transistor M1 and the signal input to the signal output end OP, and keep the signals stable, and may keep the stability of a voltage difference between the first pull-up node PU_1 and the signal output end OP when the second electrode (i.e., the first pull-up node PU_1) of the first transistor M1 is in a levitated state.

During specific implementation, according to a flow direction of the signal, the first electrode of each of the above transistors may be used as its source, and the second source may be used as its drain, or the first electrode of each of the above transistors may be used as its drain, and the second electrode may be used as its source. No specific distinction is made here.

It should be noted that each of the transistors mentioned in the above embodiments of the present disclosure may be a TFT, or a MOS (Metal Oxide Semiconductor) field-effect transistor, and is not limited herein.

In order to simplify a preparation process, during specific implementation, in the embodiment of the present disclosure, as shown in FIG. 4A, all the transistors may be P-type transistors. The P-type transistor is switched on when a voltage difference $V_{gs}$ between the gate and the source of the P-type transistor and a threshold voltage $V_{th}$ of the P-type transistor satisfy a relationship $V_{gs}<V_{th}$. For example, the first transistor M1 may be the P-type transistor, which is switched on when the relationship between the voltage difference $V_{gs1}$ between the gate and the source of the first transistor M1 and the threshold voltage $V_{th1}$ of the first transistor M1 satisfies the formula: $V_{gs1}<V_{th1}$.

Of course, in the embodiment of the present disclosure, only the P-type transistors are taken for example for illustration. For such a case that the transistors are N-type transistors, the design principle is the same as that of the present disclosure, and also falls within the scope of the protection of the present disclosure. Furthermore, the N-type transistor is switched on when a voltage difference $V_{gs}$ between the gate and the source of the N-type transistor and a threshold voltage $V_{th}$ of the N-type transistor satisfy a relationship $V_{gs}>V_{th}$. For example, the first transistor M1 may be the N-type transistor, which is switched on when the relationship between the voltage difference $V_{gs1}$ between the gate and the source of the first transistor M1 and the threshold voltage $V_{th1}$ of the first transistor M1 satisfies the formula: $V_{gs1}>V_{th1}$.

Generally, a gate insulating layer would be arranged between the gate of a transistor and an active layer. During specific implementation, a dominate gate in a double-gate type transistor may be determined by adjusting the thickness of the gate insulating layer. For example, in the embodiment of the present disclosure, the first gate of the first transistor is enabled to be dominated by adjusting the thickness of the gate insulating layer, so that the first transistor M1 is switched on when the relationship between the voltage difference $V_{gs1}$ between the gate (i.e., the first gate) and the source of the first transistor M1 and the threshold voltage $V_{th1}$ of the first transistor M1 satisfies the formula: $V_{gs1}<V_{th1}$. The voltage difference represented by $V_{gs1}$ between the first gate and the source of the first transistor M1 is illustrated below as an example.

In order to enable the threshold voltage $V_{th1}$ of the first transistor M1 to move, during specific implementation, the first threshold control signal end is configured to receive a signal at least having a level opposite to the level of the signal of the first reference signal end VREF1.

Figure 5A:
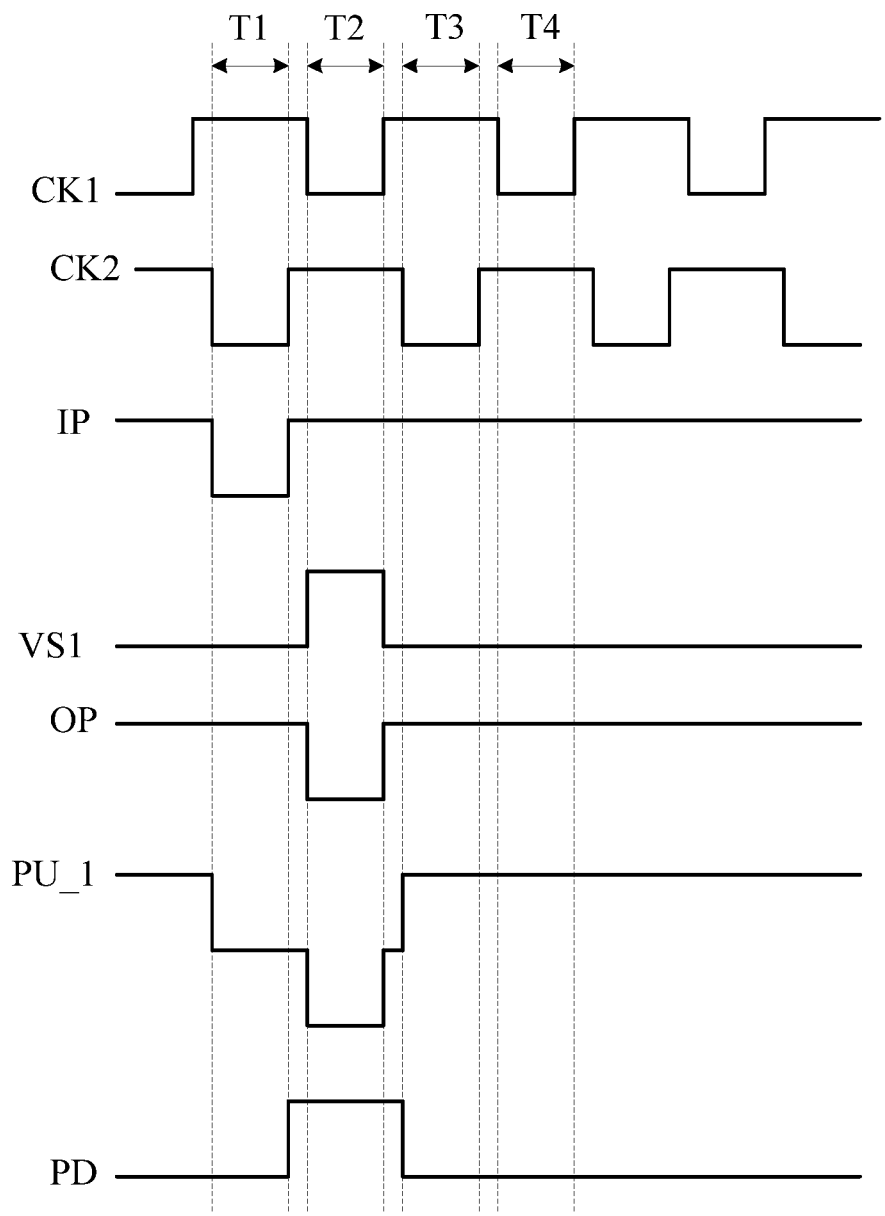
FIG. 5A is a signal time sequence diagram I provided by the embodiment of the present disclosure.

During specific implementation, in the embodiment of the present disclosure, when an effective pulse signal of the input signal end IP is a low-level signal, the signal of the first reference signal end VREF1 is a low-level signal, and the signal of the second reference signal end VREF2 is a high-level signal. The first threshold control signal end VS1 is configured to receive a signal at least having a high-level. Or, during specific implementation, in the embodiment of the present disclosure, when the effective pulse signal of the input signal end IP is a high-level signal, the signal of the first reference signal end VREF1 is a high-level signal, and the signal of the second reference signal end VREF2 is a low-level signal. The first threshold control signal end VS1 is configured to receive a signal at least having a low-level. It should be noted that as shown in FIG. 5a, the effective pulse signal of the input signal end IP refers to a low-level signal input to the second transistor M2 within one frame of time, so as to control the shift register to do output work.

Further, during specific implementation, the P-type transistor is switched off under the action of the high-level signal, and is switched on under the action of the low-level signal. The N-type transistor is switched on under the action of the high-level signal, and is switched off under the action of the low-level signal.

The foregoing is only for exemplifying the specific structure of the shift register provided by the embodiment of the present disclosure. During specific implementation, the specific structure of each of the above-mentioned circuits is not limited to the foregoing structure provided by the embodiment of the present disclosure, and may also be other structures known to those skilled in the art, and is not limited here.

The shift register shown in FIG. 4A is exemplified below to describe the working process of the above-mentioned shift register provided by the embodiment of the present disclosure in combination with the signal time sequence diagram shown in FIG. 5A. In the following description, 1 represents the high-level signal, and 0 represents the low-level signal. It should be noted that 1 and 0 are logic levels, which are merely to better explain the specific working process of the embodiment of the present disclosure, instead of indicating the voltage applied to the gate of each transistor during the specific implementation.

Specifically, an input phase T1, an output phase T2, a reset phase T3 and a reset holding phase T4 in the signal time sequence diagram as shown in FIG. 5A are selected. It should be noted that the signal time sequence diagram shown in FIG. 5A is only a working process of a certain shift register in a current frame. The working processes of the shift register in other frames are basically the same as the working process in the current frame, respectively, and will not be repeatedly described here.

At the input phase T1, IP=0, CK1=1, CK2=0, VS1=0.

Since CK1=1, the third transistor M3 is switched off. Since CK2=0, the second transistor M2 and the fifth transistor M5 are both switched on. The switched-on fifth transistor M5 may provide the low-level signal of the first reference signal end VREF1 to the pull-down node PD to enable the signal of the pull-down node PD to be the low-level signal, so as to control the fourth transistor M4 and the seventh transistor M7 to be switched on. The switched-on seventh transistor M7 may provide the high-level signal of the second reference signal end VREF2 to the signal output end OP to enable the signal output end OP to output the high-level signal. The switched-on second transistor M2 may provide the low-level signal of the input signal end IP to the second pull-up node PU_2 to enable the signal of the second pull-up node PU_2 to be the low-level signal. The sixth transistor M6 is switched on under the control of the signal of the second pull-up node PU_2 to provide the low-level signal of the second clock signal end CK2 to the pull-down node PD, so as to enable the signal of the pull-down node PD to be the low-level signal. Since VS1=0, $V_{th1}$ of the first transistor M1 may be enabled to move to right, thereby enabling the first transistor M1 to satisfy $V_{gs1} < V_{th1}$ and be completely switched on as much as possible. In the previous frame, the signal of the first pull-up node PU_1 is the high-level signal, so that an electrode, connected to the first pull-up node PU_1, of the first transistor M1 in the current frame is used as the source. The switched-on first transistor M1 switches on the second pull-up node PU_2 and the first pull-up node PU_1, thereby timely enabling the signal of the first pull-up node PU_1 to be the low-level signal to control the eighth transistor M8 to be switched on. The switched-on eighth transistor M8 provides the high-level signal of the first clock signal end CK1 to the signal output end OP to enable the signal output end OP to output the high-level signal.

After the input phase T1, and before the output phase T2, since CK2=1, the second transistor M2 and the fifth transistor M5 are both switched off. Since CK1=1, the third transistor M3 is also switched off. Therefore, the second pull-up node PU_2 and the first pull-up node PU_1 are in a levitated state, and then the first pull-up node PU_1 is kept at the low-level signal under the action of the second capacitor C2. Furthermore, due to the threshold voltage $V_{th1}$ of the first transistor M1, the voltage of the low-level signal of the first pull-up node PU_1 may be less than the voltage of the low-level signal of the second pull-up node PU_2. Therefore, at this phase, an electrode, connected to the second pull-up node PU_2, of the first transistor M1 is used as the source. Since VS1=0, $V_{th1}$ of the first transistor M1 may be enabled to move to right, thereby enabling the first transistor M1 to satisfy $V_{gs1} < V_{th1}$ and be completely switched on as much as possible. The signal of the second pull-up node PU_2 is the low-level signal, so as to control the sixth transistor M6 to be switched on. The switched-on sixth transistor M6 may provide the high-level signal of the second clock signal end CK2 to the pull-down node PD to enable the signal of the pull-down node PD to be the high-level signal, so as to control the fourth transistor M4 and the seventh transistor M7 to be switched off. The eighth transistor M8 is switched on under the control of the signal of the first pull-up node PU_1 to provide the high-level signal of the first clock signal end CK1 to the signal output end OP to enable the signal output end OP to output the high-level signal.

At the output phase T2, IP=1, CK1=0, CK2=1, VS1=1.

Since CK2=1, the second transistor M2 and the fifth transistor M5 are both switched off, and then the first pull-up node PU_1 is kept at the low-level signal under the action of the second capacitor C2 to control the eighth transistor M8 to be switched on, thereby providing the low-level signal of the first clock signal end CK1 to the signal output end OP to enable the signal output end OP to output the low-level signal. Under the action of the second capacitor C2, the level of the first pull-up node PU_1 is further pulled down to control the eighth transistor M8 to be completely switched on as much as possible to provide the low-level signal of the first clock signal end CK1 to the signal output end OP, so that the signal output end OP outputs the low-level signal.

Furthermore, due to the threshold voltage $V_{th1}$ of the first transistor M1, the voltage of the low-level signal of the first pull-up node PU_1 may be less than the voltage of the low-level signal of the second pull-up node PU_2. Therefore, at this phase, an electrode, electrically connected to the second pull-up node PU_2, of the first transistor M1 is used as the source. Since VS1=1, $V_{th1}$ of the first transistor M1 may be enabled to move to left. The voltage of the gate of the first transistor M1 is the voltage of the low-level signal, and the voltage of the source of the first transistor M1 is the voltage of the low-level signal, so that the first transistor M1 may not satisfy $V_{gs1} < V_{th1}$, and then is switched off. Therefore, the level of the first pull-up node PU_1 may be kept stable, and the phenomenon of an unstable output of the signal output end OP due to the rise of the level, caused by leakage, of the first pull-up node PU_1 is avoided. Furthermore, due to the action of the first capacitor C1, the signal of the pull-down node PD may be kept being the high-level signal, thereby controlling the fourth transistor M4 and the seventh transistor M7 to be both switched off and avoiding adverse effect on the signal output by the signal output end OP.

At the reset phase T3, IP=1, CK1=1, CK2=0, VS1=0.

Since CK2=0, the second transistor M2 and the fifth transistor M5 are both switched on. The switched-on second transistor M2 may provide the high-level signal of the input signal end IP to the second pull-up node PU_2 to enable the signal of the second pull-up node PU_2 to be the high-level signal, so as to control the sixth transistor M6 to be switched off. Furthermore, at this phase, an electrode, electrically connected to the second pull-up node PU_2, of the first transistor M1 is used as the source. The first transistor M1 is switched on since it satisfies $V_{gs1} < V_{th1}$. Therefore, the second pull-up node PU_2 and the first pull-up node PU_1 are switched on, so as to control the eighth transistor M8 to be switched off. The switched-on fifth transistor M5 may provide the low-level signal of the first reference signal end VREF1 to the pull-down node PD to enable the signal of the pull-down node PD to be the low-level signal, so as to control the fourth transistor M4 and the seventh transistor M7 to be switched on. Furthermore, since CK1 is equal to 1, the third transistor M3 is switched off. The switched-on seventh transistor M7 may provide the high-level signal of the second reference signal end VREF2 to the signal output end OP to enable the signal output end OP to output the high-level signal.

At the reset holding phase T4, IP=1, CK1=0, CK2=1, VS1=0.

Since CK2=1, the second transistor M2 and the fifth transistor M5 are both switched off. Due to the action of the first capacitor C1, the signal of the pull-down node PD may be kept being the low-level signal, so as to control the fourth transistor M4 and the seventh transistor M7 to be switched on. Since CK1=0, the third transistor m3 is switched on. The switched-on third transistor M3 and fourth transistor M4 may provide the high-level signal of the second reference signal end VREF2 to the second pull-up node PU_2 to enable the signal of the second pull-up node PU_2 to be at the high level, so as to control the sixth transistor M6 to be switched off. Furthermore, at this phase, an electrode, electrically connected to the second pull-up node PU_2, of the first transistor M1 is used as the source. The first transistor M1 is switched on since it satisfies $V_{gs1} < V_{th1}$. Therefore, the second pull-up node PU_2 and the first pull-up node PU_1 are switched, so as to control the eighth transistor M8 to be switched off. The switched-on seventh transistor M7 may provide the high-level signal of the second reference signal end VREF2 to the signal output end OP to enable the signal output end OP to output the high-level signal.

After the reset holding phase T4, the working processes of the reset phase T3 and the reset holding phase T4 are repeatedly executed all the time until the level of the signal of the input signal end IP changes to the low level again.

It should be noted that a buffer phase is provided between the input phase T1 and the output phase T2, between the output phase T2 and the reset phase T3, and between the reset phase T3 and the reset holding phase T4, respectively. At the buffer phase, the characteristics of the transistors in the shift register may be stabilized, and the next working phase is continued after the characteristics are stabilized. Furthermore, in this way, the rising edge of the signal of the first clock signal end CK1 and the falling edge of the signal of the second clock signal end CK2 may be avoided from being aligned, and the falling edge of the signal of the first clock signal end CK1 and the rising edge of the signal of the second clock signal end CK2 may be avoided from being aligned, thereby improving the stability of the shift register.

It should be noted that in actual application, the specific voltage values of the various above-mentioned signals may be designed and determined according to an actual application environment, and are not limited here.

Figure 5B:
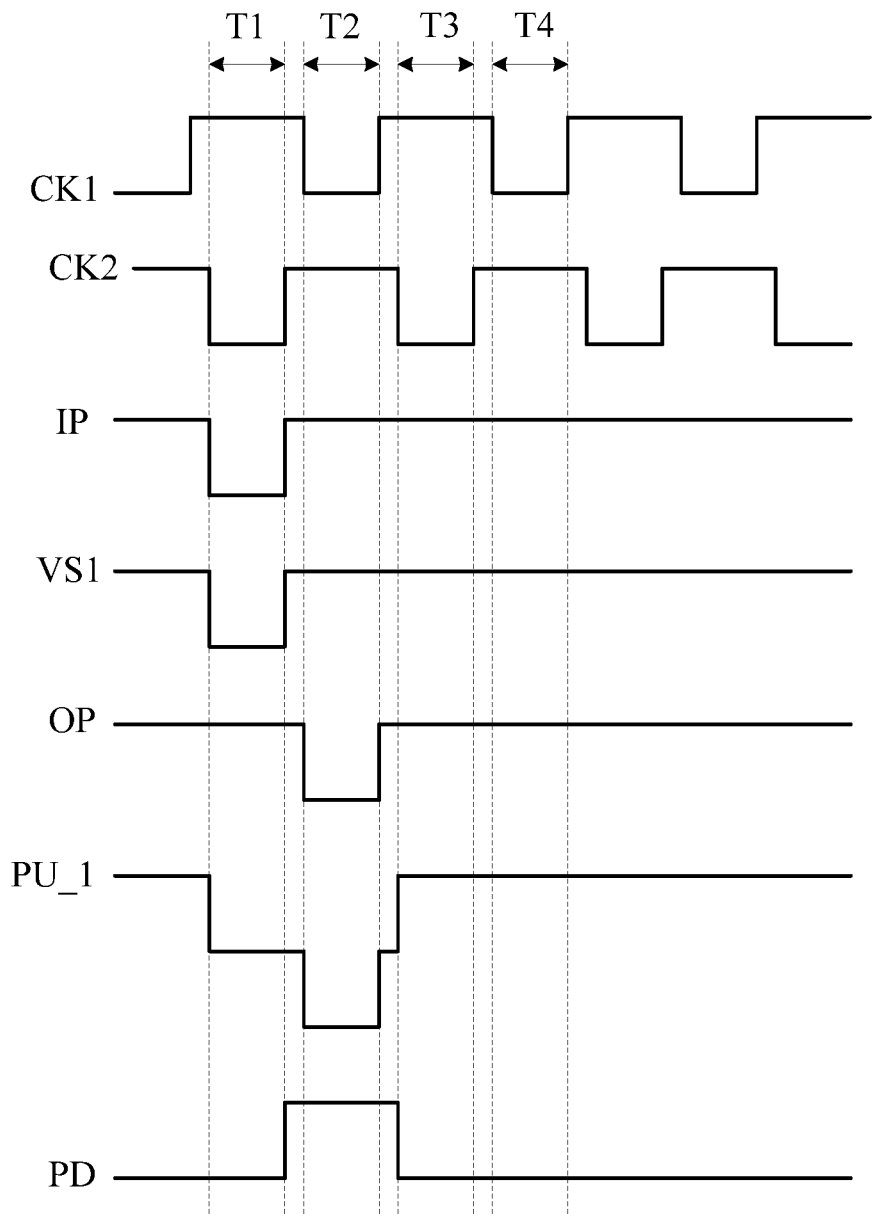
FIG. 5B is a signal time sequence diagram II provided by the embodiment of the present disclosure.

The embodiment of the present disclosure further provides some other signal time sequence diagrams of the shift register. As shown in FIG. 5B, the implementation mode shown in FIG. 5A is transformed. Only differences between the present embodiment and the embodiment of the shift register shown in FIG. 4a are illustrated below, and similarities are omitted here.

During specific implementation, in the embodiment of the present disclosure, as shown in FIG. 5B, the first threshold control signal end VS1 uses a signal that is the same as the signal of the input signal end IP. The first threshold control signal end VS1 and the input signal end IP may be input into the shift register by using different signal lines. Or, the first threshold control signal end VS1 and the input signal end IP may be input into the shift register by using a same signal line, thereby reducing the number of the signal lines.

The shift register shown in FIG. 4A is exemplified below to describe the working process of the above-mentioned shift register provided by the embodiment of the present disclosure in combination with the signal time sequence diagram shown in FIG. 5B. Specifically, an input phase T1, an output phase T2, a reset phase T3 and a reset holding phase T4 in the signal time sequence diagram as shown in FIG. 5B are selected.

At the input phase T1, IP=0, CK1=1, CK2=0, VS1=0.

Since CK1=1, the third transistor M3 is switched off. Since CK2=0, the second transistor M2 and the fifth transistor M5 are both switched on. The switched-on fifth transistor M5 may provide the low-level signal of the first reference signal end VREF1 to the pull-down node PD to enable the signal of the pull-down node PD to be the low-level signal, so as to control the fourth transistor M4 and the seventh transistor M7 to be switched on. The switched-on seventh transistor M7 may provide the high-level signal of the second reference signal end VREF2 to the signal output end OP to enable the signal output end OP to output the high-level signal. The switched-on second transistor M2 may provide the low-level signal of the input signal end IP to the second pull-up node PU_2 to enable the signal of the second pull-up node PU_2 to be the low-level signal. The sixth transistor M6 is switched on under the control of the signal of the second pull-up node PU_2 to provide the low-level signal of the second clock signal end CK2 to the pull-down node PD, so as to enable the signal of the pull-down node PD to be the low-level signal. Since VS1=0, $V_{th1}$ of the first transistor M1 may be enabled to move to right, thereby enabling the first transistor M1 to satisfy $V_{gs1}<V_{th1}$ and be completely switched on as much as possible. In the previous frame, the signal of the first pull-up node PU_1 is the high-level signal, so that an electrode, connected to the first pull-up node PU_1, of the first transistor M1 in the current frame is used as the source. The switched-on first transistor M1 switches on the second pull-up node PU_2 and the first pull-up node PU_1, thereby timely enabling the signal of the first pull-up node PU_1 to be the low-level signal to control the eighth transistor M8 to be switched on. The switched-on eighth transistor M8 provides the high-level signal of the first clock signal end CK1 to the signal output end OP to enable the signal output end OP to output the high-level signal.

After the input phase T1, and before the output phase T2, since CK2=1, the second transistor M2 and the fifth transistor M5 are both switched off. Since CK1=1, the third transistor M3 is also switched off. Therefore, the second pull-up node PU_2 and the first pull-up node PU_1 are in a levitated state, and then the first pull-up node PU_1 is kept at the low-level signal under the action of the second capacitor C2. Furthermore, due to the threshold voltage $V_{th1}$ of the first transistor M1, the voltage of the low-level signal of the first pull-up node PU_1 may be less than the voltage of the low-level signal of the second pull-up node PU_2. Therefore, at this phase, an electrode, connected to the second pull-up node PU_2, of the first transistor M1 is used as the source. Since VS1=1, $V_{th1}$ of the first transistor M1 may be enabled to move to left, so that the first transistor M1 may not satisfy $V_{gs1}<V_{th1}$, and then is switched off. Due to coupling capacitance of the transistor, the signal of the second pull-up node PU_2 may be enabled to be the low-level signal, so as to control the sixth transistor M6 to be switched on. The switched-on sixth transistor M6 may provide the high-level signal of the second clock signal end CK2 to the pull-down node PD to enable the signal of the pull-down node PD to be the high-level signal, so as to control the fourth transistor M4 and the seventh transistor M7 to be switched off. The eighth transistor M8 is switched on under the control of the signal of the first pull-up node PU_1 to provide the high-level signal of the first clock signal end CK1 to the signal output end OP to enable the signal output end OP to output the high-level signal.

At the output phase T2, IP=1, CK1=0, CK2=1, VS1=1.

Since CK2=1, the second transistor M2 and the fifth transistor M5 are both switched off, and then the first pull-up node PU_1 is kept at the low-level signal under the action of the second capacitor C2 to control the eighth transistor M8 to be switched on, thereby providing the low-level signal of the first clock signal end CK1 to the signal output end OP to enable the signal output end OP to output the low-level signal. Under the action of the second capacitor C2, the level of the first pull-up node PU_1 is further pulled down to control the eighth transistor M8 to be completely switched on as much as possible to provide the low-level signal of the first clock signal end CK1 to the signal output end OP, so that the signal output end OP outputs the low-level signal. Furthermore, due to the threshold voltage $V_{th1}$ of the first transistor M1, the voltage of the low-level signal of the first pull-up node PU_1 may be less than the voltage of the low-level signal of the second pull-up node PU_2. Therefore, at this phase, an electrode, electrically connected to the second pull-up node PU_2, of the first transistor M1 is used as the source. Since VS1=1, $V_{th1}$ of the first transistor M1 may be enabled to move to left. The gate of the first transistor M1 has the voltage of the low-level signal, and the voltage of the source of the first transistor M1 is the voltage of the low-level signal, so that the first transistor M1 may not satisfy $V_{gs1}<V_{th1}$, and then is switched off as much as possible. Therefore, the level of the first pull-up node PU_1 may be kept stable, and the phenomenon of an unstable output of the signal output end OP due to the rise of the level, caused by leakage, of the first pull-up node PU_1 is avoided. Furthermore, due to the action of the first capacitor C1, the signal of the pull-down node PD may be kept being the high-level signal, thereby controlling the fourth transistor M4 and the seventh transistor M7 to be both switched off and avoiding adverse effect on the signal output by the signal output end OP.

At the reset phase T3, IP=1, CK1=1, CK2=0, VS1=1.

Since CK2=0, the second transistor M2 and the fifth transistor M5 are both switched on. The switched-on second transistor M2 may provide the high-level signal of the input signal end IP to the second pull-up node PU_2 to enable the signal of the second pull-up node PU_2 to be the high-level signal, so as to control the sixth transistor M6 to be switched off. Furthermore, at this phase, an electrode, electrically connected to the second pull-up node PU_2, of the first transistor M1 is used as the source. Although VS1=1, $V_{th1}$ of the first transistor M1 may be enabled to move to left. However, the gate of the first transistor M1 has the voltage of the low-level signal, and the voltage of the source of the first transistor M1 is the voltage of the high-level signal, so that the first transistor M1 may be enabled to satisfy $V_{gs1}<V_{th1}$ and be switched on, and the second pull-up node PU_2 and the first pull-up node PU_1 are switched on, so as to control the eighth transistor M8 to be switched off. The switched-on fifth transistor M5 may provide the low-level signal of the first reference signal end VREF1 to the pull-down node PD to enable the signal of the pull-down node PD to be the low-level signal, so as to control the fourth transistor M4 and the seventh transistor M7 to be switched on. Furthermore, since CK1=1, the third transistor m3 is switched off. The switched-on seventh transistor M7 may provide the high-level signal of the second reference signal end VREF2 to the signal output end OP to enable the signal output end OP to output the high-level signal.

At the reset holding phase T4, IP=1, CK1=0, CK2=1, VS1=1.

Since CK2=1, the second transistor M2 and the fifth transistor M5 are both switched off. Due to the action of the first capacitor C1, the signal of the pull-down node PD may be kept being the low-level signal, so as to control the fourth transistor M4 and the seventh transistor M7 to be switched on. Since CK1=0, the third transistor m3 is switched on. The switched-on third transistor M3 and fourth transistor M4 may provide the high-level signal of the second reference signal end VREF2 to the second pull-up node PU_2 to enable the signal of the second pull-up node PU_2 to be at the high level, so as to control the sixth transistor M6 to be switched off. Furthermore, at this phase, an electrode, electrically connected to the second pull-up node PU_2, of the first transistor M1 is used as the source. Although VS1=1, $V_{th1}$ of the first transistor M1 may be enabled to move to left. However, the gate of the first transistor M1 has the voltage of the low-level signal, and the voltage of the source of the first transistor M1 is the voltage of the high-level signal, so that the first transistor M1 may be enabled to satisfy $V_{gs1}<V_{th1}$ and be switched on, and the second pull-up node PU_2 and the first pull-up node PU_1 are switched on, so as to control the eighth transistor M8 to be switched off. The switched-on seventh transistor M7 may provide the high-level signal of the second reference signal end VREF2 to the signal output end OP to enable the signal output end OP to output the high-level signal.

After the reset holding phase T4, the working processes of the reset phase T3 and the reset holding phase T4 are repeatedly executed all the time until the level of the signal of the input signal end IP changes to the low level again.

Figure 4B:
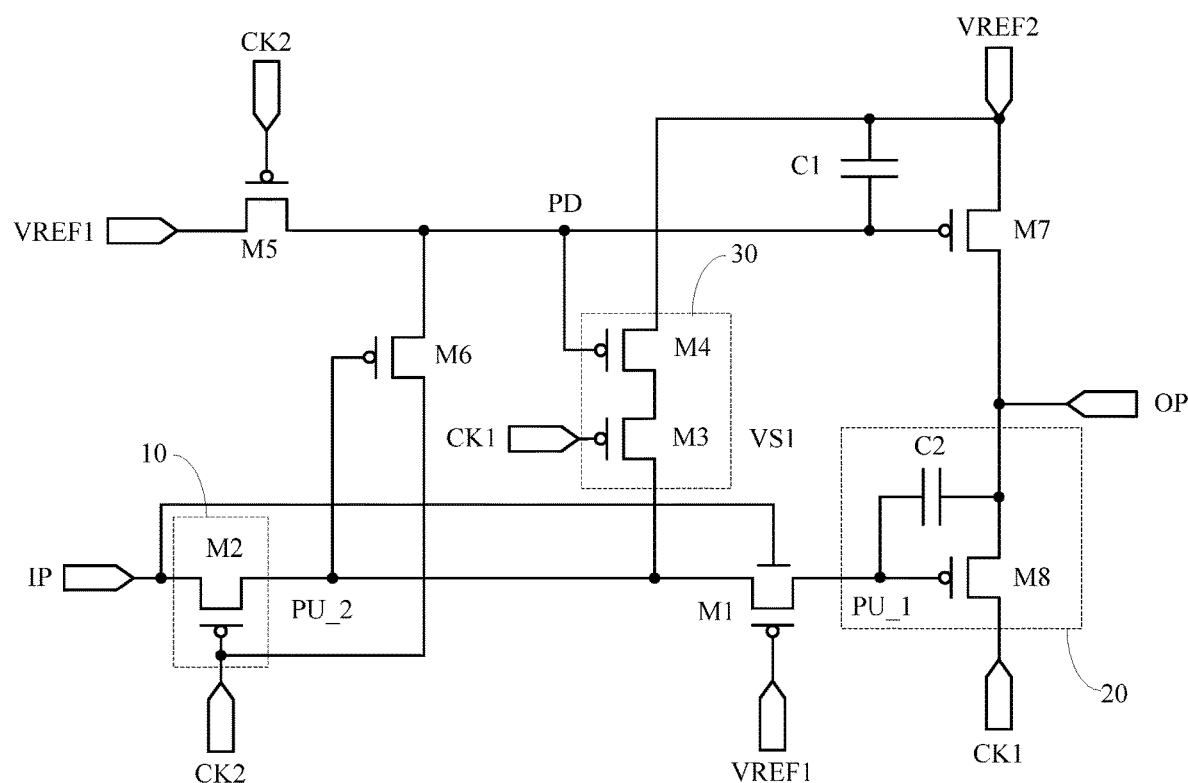
FIG. 4B is a schematic structural diagram II of a shift register provided by the embodiment of the present disclosure.

The embodiment of the present disclosure provides some other shift registers. As shown in FIG. 4B, the implementation mode shown in FIG. 4A is transformed. Only differences between the present embodiment and the embodiment of the shift register shown in FIG. 4A are illustrated below, and similarities are omitted here.

During specific implementation, in the embodiment of the present disclosure, as shown in FIG. 4B, the second gate of the first transistor M1 may be enabled to be coupled to the first electrode of the second transistor M2, so as to further reduce the usage space of the signal lines. Furthermore, the signal time sequence diagram corresponding to the shift register shown in FIG. 4B is as shown in FIG. 5B. The working processes of the shift register shown in FIG. 4B may refer to the working processes of the shift register shown in FIG. 4A under the signal time sequence diagram shown in FIG. 5B, and will not be repeatedly described here. Or, during specific implementation, in the embodiment of the present disclosure, the second gate of the first transistor M1 may be enabled to be coupled to the gate of the second transistor M2, so as to further reduce the usage space of the signal lines, which is not limited here.

Figure 6:
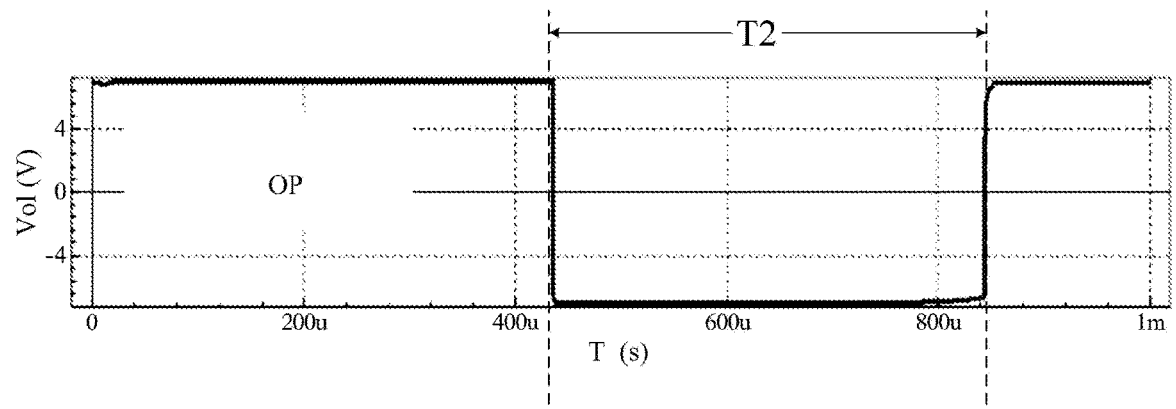
FIG. 6 is a simulation diagram corresponding to the signal output end of the shift register shown in FIG. 4B.

Furthermore, still according to the signal time sequence diagram shown in FIG. 5B, the signal output by the signal output end OP of the shift register shown in FIG. 4B is simulated, the simulation diagram of which is as shown in FIG. 6. The X-coordinate represents time, and the Y-coordinate represents voltage. It can be known in combination with FIG. 4B, FIG. 5B, and FIG. 6, at the output phase T2, the signal output end OP may stably output the signal, thereby avoiding the problem of unsteadiness caused by the leakage of the first pull-up node PU_1.

Figure 7:
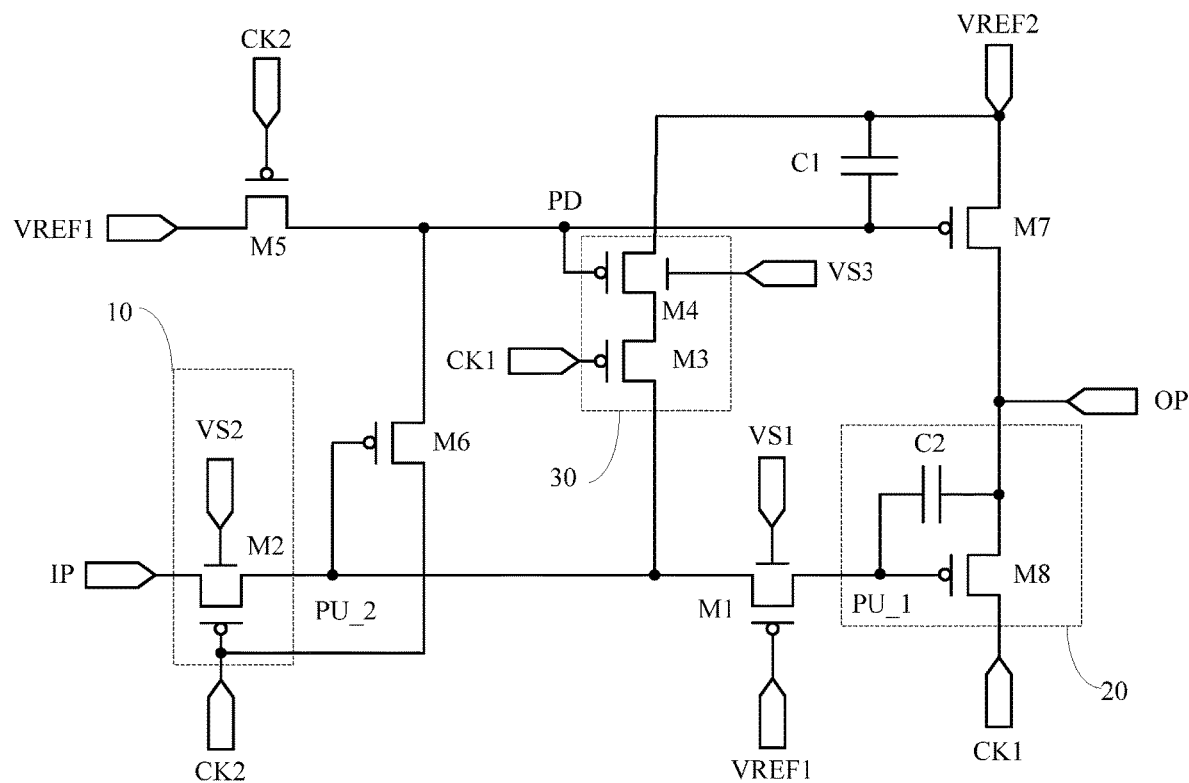
FIG. 7 is a schematic structural diagram III of a shift register provided by the embodiment of the present disclosure.

The embodiment of the present disclosure provides some other shift registers. As shown in FIG. 7, the implementation mode shown in FIG. 4A is transformed. Only differences between the present embodiment and the embodiment of the shift register shown in FIG. 4A are illustrated below, and similarities are omitted here.

During specific implementation, in the embodiment of the present disclosure, as shown in FIG. 7, the input circuit 10 may also include: a double-gate type second transistor M2. The first gate of the second transistor M2 is configured to be coupled to the second clock signal end CK2, and the second gate of the second transistor M2 is configured to be coupled to a second threshold control signal end VS2. The first electrode of the second transistor M2 is configured to be coupled to the input signal end IP, and the second electrode of the second transistor M2 is coupled to the first electrode (i.e., the second pull-up node PU_2) of the first transistor M1.

Figure 8:
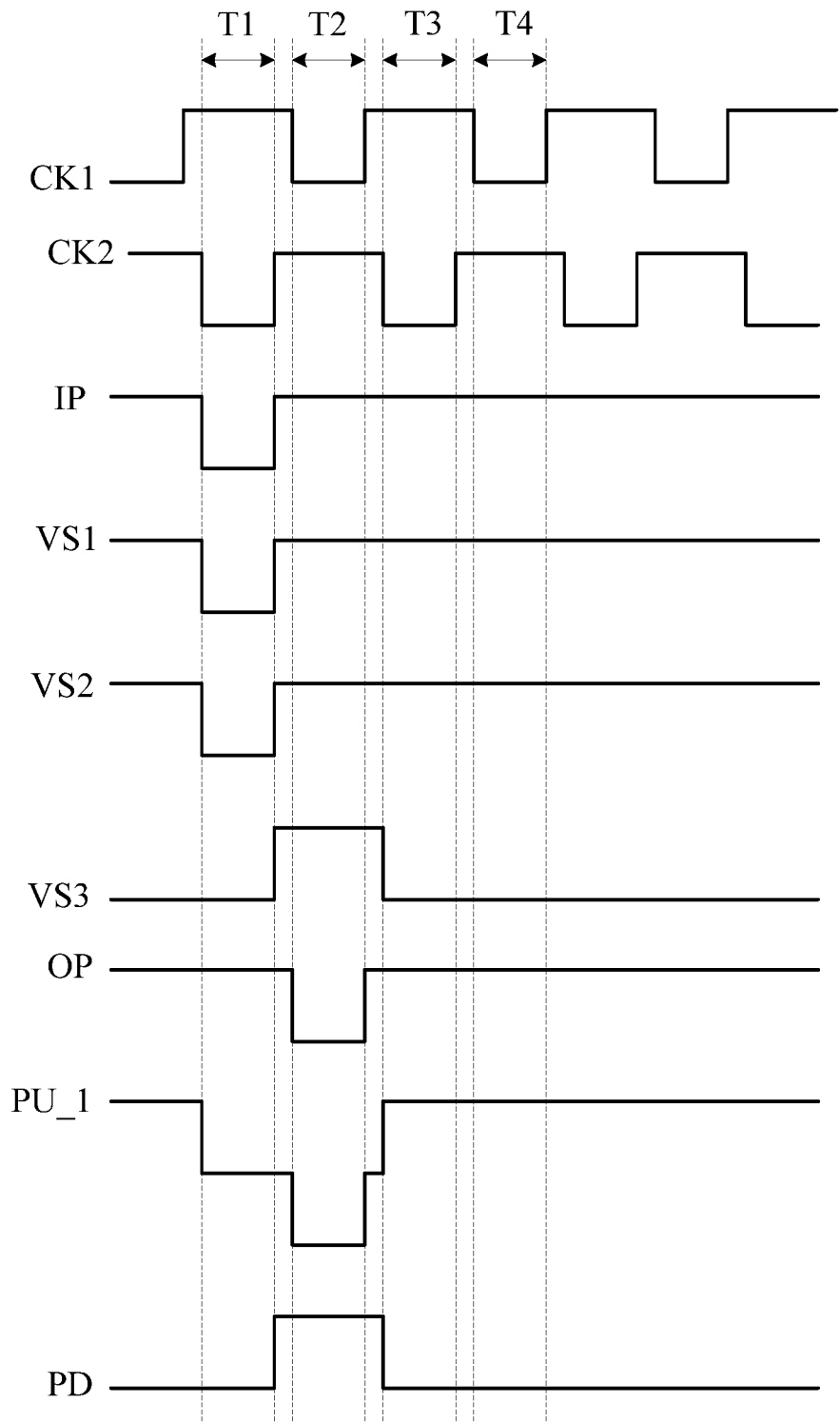
FIG. 8 is a signal time sequence diagram III provided by the embodiment of the present disclosure.

During specific implementation, in the embodiment of the present disclosure, the second threshold control signal end VS2 is configured to receive a signal at least having a level opposite to the level of a signal of the first reference signal end VREF1. For example, as shown in FIG. 8, the level of one part of the signals of the second threshold control signal end VS2 may be opposite to the level of the signal of the first reference signal end VREF1. Furthermore, the level of the other part of the signals of the second threshold control signal end VS2 may be the same as the level of the signal of the first reference signal end VREF1.

During specific implementation, in the embodiment of the present disclosure, the first gate of the second transistor is enabled to be dominated by adjusting the thickness of the gate insulating layer, so that the second transistor M2 is switched on when the relationship between the voltage difference $V_{gs2}$ between the gate (i.e., the first gate) and the source of the second transistor M2 and the threshold voltage $V_{th2}$ of the second transistor M2 satisfies the formula: $V_{gs2} < V_{th2}$. The voltage difference represented by $V_{gs2}$ between the first gate and the source of the second transistor M2 is illustrated below as an example.

During specific implementation, in the embodiment of the present disclosure, as shown in FIG. 7, the pull-up control circuit 30 may also include: a third transistor M3 and a double-gate type fourth transistor M4. The gate of the third transistor M3 is configured to be coupled to the first clock signal end CK1. The first electrode of the third transistor M3 is coupled to the first electrode (i.e., the second pull-up node PU_2) of the first transistor M1. The second electrode of the third transistor M3 is coupled to the first electrode of the fourth transistor M4. The first gate of the fourth transistor M4 is coupled to the gate (i.e., the pull-down node PD) of the seventh transistor M7. The second gate of the fourth transistor M4 is configured to be coupled to a third threshold control signal end VS3. The second electrode of the fourth transistor M4 is configured to be coupled to the second reference signal end VREF2.

During specific implementation, in the embodiment of the present disclosure, the third threshold control signal end VS3 is configured to receive a signal at least having a level opposite to the level of a signal of the first reference signal end VREF1. For example, as shown in FIG. 8, the level of one part of the signals of the third threshold control signal end VS3 may be opposite to the level of the signal of the first reference signal end VREF1. Furthermore, the level of the other part of the signals of the third threshold control signal end VS3 may be the same as the level of the signal of the first reference signal end VREF1.

During specific implementation, in the embodiment of the present disclosure, the first gate of the fourth transistor is enabled to be dominated by adjusting the thickness of the gate insulating layer, so that the fourth transistor M4 is switched on when the relationship between the voltage difference $V_{gs4}$ between the gate (i.e., the first gate) and the source of the fourth transistor M4 and the threshold voltage $V_{th4}$ of the fourth transistor M4 satisfies the formula: $V_{gs4} < V_{th4}$. The voltage difference represented by $V_{gs4}$ between the first gate and the source of the fourth transistor M4 is illustrated below as an example.

The shift register shown in FIG. 7 is exemplified below to describe the working process of the above-mentioned shift register provided by the embodiment of the present disclosure in combination with the signal time sequence diagram shown in FIG. 8.

Specifically, an input phase T1, an output phase T2, a reset phase T3 and a reset holding phase T4 in the signal time sequence diagram as shown in FIG. 8 are selected.

At the input phase T1, IP=0, CK1=1, CK2=0, VS1=0, VS2=0, VS3=0.

Since CK1=1, the third transistor M3 is switched off. Since CK2=0, the fifth transistor M5 is switched on to provide the low-level signal of the first reference signal end VREF1 to the pull-down node PD to enable the signal of the pull-down node PD to be the low-level signal, so as to control the seventh transistor M7 to be switched on. The switched-on seventh transistor M7 may provide the high-level signal of the second reference signal end VREF2 to the signal output end OP to enable the signal output end OP to output the high-level signal. Since CK2=0, and VS2=0, the threshold voltage $V_{th2}$ of the second transistor M2 may be enabled to move to right, thereby enabling the second transistor M2 to be completely switched on as much as possible, so as to accelerate a charge process of providing the low-level signal of the input signal end IP to the second pull-up node PU_2 to enable the signal of the second pull-up node PU_2 to be the low-level signal as soon as possible. The sixth transistor M6 is switched on under the control of the signal of the second pull-up node PU_2 to provide the low-level signal of the second clock signal end CK2 to the pull-down node PD, so as to enable the signal of the pull-down node PD to be the low-level signal. Since VS1=0, $V_{th1}$ of the first transistor M1 may be enabled to move to right, so that the first transistor M1 satisfies $V_{gs1}<V_{th1}$, and then is completely switched on as much as possible. The switched-on first transistor M1 switches on the second pull-up node PU_2 and the first pull-up node PU_1, thereby timely enabling the signal of the first pull-up node PU_1 to be the low-level signal to control the eighth transistor M8 to be switched on. The switched-on eighth transistor M8 provides the high-level signal of the first clock signal end CK1 to the signal output end OP to enable the signal output end OP to output the high-level signal.

After the input phase T1, and before the output phase T2, since CK2=1, the fifth transistor M5 is switched off. Since CK1=1, the third transistor M3 is also switched off. Since VS1 is equal to 1, and CK2=1, $V_{th2}$ of the second transistor M2 may be enabled to move to left, and the second transistor M2 may not satisfy $V_{gs2}<V_{th1}$ and is switched off as much as possible. The first pull-up node PU_1 is kept at the low-level signal under the action of the second capacitor C2. Furthermore, due to the threshold voltage $V_{th1}$ of the first transistor M1, the voltage of the low-level signal of the first pull-up node PU_1 may be less than the voltage of the low-level signal of the second pull-up node PU_2. Therefore, at this phase, an electrode, electrically connected to the second pull-up node PU_2, of the first transistor M1 is used as the source. Since VS1=1, $V_{th1}$ of the first transistor M1 may be enabled to move to left, so that the first transistor M1 may not satisfy $V_{gs1}<V_{th1}$, and then is switched off. Due to coupling capacitance of the transistor, the signal of the second pull-up node PU_2 may be enabled to be the low-level signal, so as to control the sixth transistor M6 to be switched on. The switched-on sixth transistor M6 may provide the high-level signal of the second clock signal end CK2 to the pull-down node PD to enable the signal of the pull-down node PD to be the high-level signal, so as to control the fourth transistor M4 and the seventh transistor M7 to be switched off. The eighth transistor M8 is switched on under the control of the signal of the first pull-up node PU_1 to provide the high-level signal of the first clock signal end CK1 to the signal output end OP to enable the signal output end OP to output the high-level signal.

At the output phase T2, IP=1, CK1=0, CK2=1, VS1=1, VS2=1, VS3=1.

Since CK2=1, the fifth transistor M5 is switched off. The first pull-up node PU_1 is kept at the low-level signal under the action of the second capacitor C2 to control the eighth transistor M8 to be switched on, thereby providing the low-level signal of the first clock signal end CK1 to the signal output end OP to enable the signal output end OP to output the low-level signal. Under the action of the second capacitor C2, the level of the first pull-up node PU_1 is further pulled down to control the eighth transistor M8 to be completely switched on as much as possible to provide the low-level signal of the first clock signal end CK1 to the signal output end OP, so that the signal output end OP outputs the low-level signal. Furthermore, due to the threshold voltage $V_{th1}$ of the first transistor M1, the voltage of the low-level signal of the first pull-up node PU_1 may be less than the voltage of the low-level signal of the second pull-up node PU_2. Therefore, at this phase, an electrode, electrically connected to the second pull-up node PU_2, of the first transistor M1 is used as the source. Since VS1=1, $V_{th1}$ of the first transistor M1 may be enabled to move to left. The gate of the first transistor M1 has the voltage of the low-level signal, and the voltage of the source of the first transistor M1 is the voltage of the low-level signal, so that the first transistor M1 may not satisfy $V_{gs1}<V_{th1}$, and then is switched off. Therefore, the level of the first pull-up node PU_1 may be kept stable, and the phenomenon of an unstable output of the signal output end OP due to the rise of the level, caused by leakage, of the first pull-up node PU_1 is avoided. Furthermore, since CK2=1, and VS2=1, the threshold voltage of the second transistor M2 may be enabled to move to left, and the second transistor M2 may be completely switched off as much as possible, so as to avoid the influence, caused by the leakage of the second transistor M2, on the second pull-up node PU_2 and prolong the holding time of the low-level signal of the second pull-up node PU_2. Furthermore, since VS3=1, and the signal of the pull-down node PD is the high-level signal, the threshold voltage of the fourth transistor M4 may be enabled to move to left, and the fourth transistor M4 may be completely switched off as much as possible, so as to avoid the influence, caused by the leakage of the fourth transistor M4, on the second pull-up node PU_2 and prolong the holding time of the low-level signal of the second pull-up node PU_2. The sixth transistor M6 provides the high-level signal of the second clock signal end CK2 to the pull-down node PD under the control of the signal of the second pull-up node PU_2, so as to control the seventh transistor M7 to be switched off and avoid the adverse effect on the signal output by the signal output end OP.

At the reset phase T3, IP=1, CK1=1, CK2=0, VS1=1, VS2=1, VS3=0.

Since CK2=0, the second transistor M2 and the fifth transistor M5 are both switched on. The switched-on second transistor M2 may provide the high-level signal of the input signal end IP to the second pull-up node PU_2 to enable the signal of the second pull-up node PU_2 to be the high-level signal, so as to control the sixth transistor M6 to be switched off. Furthermore, at this phase, an electrode, electrically connected to the second pull-up node PU_2, of the first transistor M1 is used as the source. Although VS1=1, $V_{th1}$ of the first transistor M1 may be enabled to move to left. However, the gate of the first transistor M1 has the voltage of the low-level signal, and the voltage of the source of the first transistor M1 is the voltage of the high-level signal, so that the first transistor M1 may be enabled to satisfy $V_{gs1}<V_{th1}$ and be switched on, and the second pull-up node PU_2 and the first pull-up node PU_1 are switched on, so as to control the eighth transistor M8 to be switched off. The switched-on fifth transistor M5 provides the low-level signal of the first reference signal end VREF1 to the pull-down node PD to enable the signal of the pull-down node PD to be the low-level signal, so as to control the seventh transistor M7 to be switched on. The switched-on seventh transistor M7 may provide the high-level signal of the second reference signal end VREF2 to the signal output end OP to enable the signal output end OP to output the high-level signal. Furthermore, since CK1=1, the third transistor M3 is switched off.

At the reset holding phase T4, IP=1, CK1=0, CK2=1, VS1=1, VS2=1, VS3=0.

Since CK2=1, the second transistor M2 and the fifth transistor M5 are both switched off, and then the signal of the pull-down node PD is kept being the low-level signal under the action of the first capacitor C1 to control the seventh transistor M7 to be switched on, thereby providing the high-level signal of the second reference signal end VREF2 to the signal output end OP to enable the signal output end OP to output the high-level signal. Since VS3=0, and the signal of the pull-down node PD is the low-level signal, the fourth transistor M4 is controlled to be completely switched on as much as possible. Since CK1=0, the third transistor M3 is switched on. The switched-on third transistor M3 and fourth transistor M4 may timely provide the high-level signal of the second reference signal end VREF2 to the second pull-up node PU_2 to timely control the signal of the second pull-up node PU_2 to be at the high level, so as to control the sixth transistor M6 to be switched off. Furthermore, at this phase, an electrode, electrically connected to the second pull-up node PU_2, of the first transistor M1 is used as the source. Although VS1=1, $V_{th1}$ of the first transistor M1 may be enabled to move to left. However, the gate of the first transistor M1 has the voltage of the low-level signal, and the voltage of the source of the first transistor M1 is the voltage of the high-level signal, so that the first transistor M1 may be enabled to satisfy $V_{gs1} < V_{th1}$ and be switched on, and the second pull-up node PU_2 and the first pull-up node PU_1 are switched on, so as to control the eighth transistor M8 to be switched off.

After the reset holding phase T4, the working processes of the reset phase T3 and the reset holding phase T4 are repeatedly executed all the time until the level of the signal of the input signal end IP changes to the high level again.

Figure 9A:
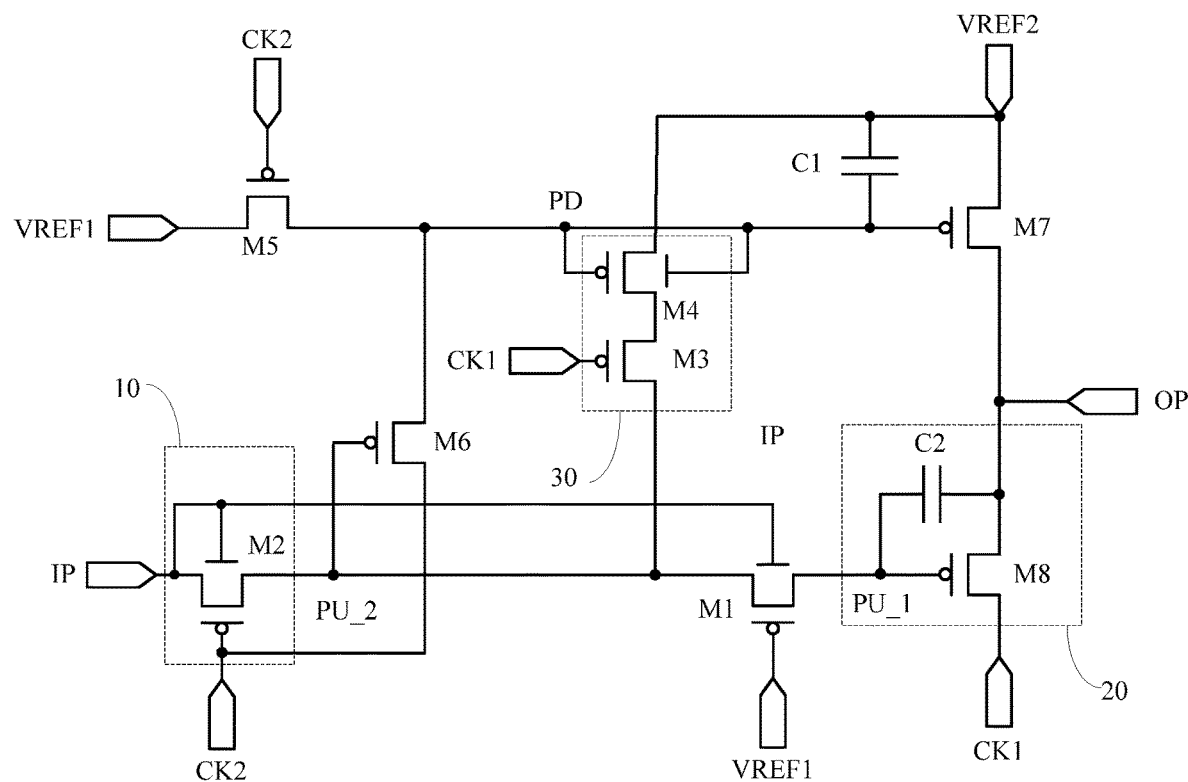
FIG. 9A is a schematic structural diagram IV of a shift register provided by the embodiment of the present disclosure.

The embodiment of the present disclosure provides some other shift registers. As shown in FIG. 9A, the implementation mode shown in FIG. 7 is transformed. Only differences between the present embodiment and the embodiment of the shift register shown in FIG. 7 are illustrated below, and similarities are omitted here.

In order to reduce the signal lines for signal transmission, during specific implementation, in the embodiment of the present disclosure, as shown in FIG. 9A, the second gate of the first transistor M1 may be enabled to be coupled to the first electrode of the second transistor M2. In this way, the first threshold control signal end and the input signal end may be configured to receive a same signal. That is, the second gate of the first transistor M1 receives the signal of the input signal end IP, so as to further reduce the usage space of the signal lines. In this way, a same signal line may be used to input the signal to the first threshold control signal end and the input signal end.

In order to reduce the signal lines for signal transmission, during specific implementation, in the embodiment of the present disclosure, as shown in FIG. 9A, the second gate of the second transistor M2 may be enabled to be coupled to the first electrode of the second transistor M2. In this way, the second threshold control signal end and the input signal end may be configured to receive a same signal. That is, the second gate of the second transistor M2 receives the signal of the input signal end IP, so as to further reduce the usage space of the signal lines. In this way, a same signal line may be used to input the signal to the second threshold control signal end and the input signal end.

In order to reduce the signal lines for signal transmission, during specific implementation, in the embodiment of the present disclosure, the first threshold control signal end and the second threshold control signal end may be configured to receive a same signal. As shown in FIG. 9A, the second gate of the first transistor M1 may be enabled to be coupled to the second gate of the second transistor M2, so as to both receive the signal of the input signal end IP.

In order to reduce the signal lines for signal transmission, during specific implementation, in the embodiment of the present disclosure, the signal of the third threshold control signal end and the signal of the pull-down node may be set as a same signal. As shown in FIG. 9A, the second gate of the fourth transistor M4 may be enabled to be coupled to the gate (i.e., the pull-down node PD) of the seventh transistor M7.

Figure 9B:
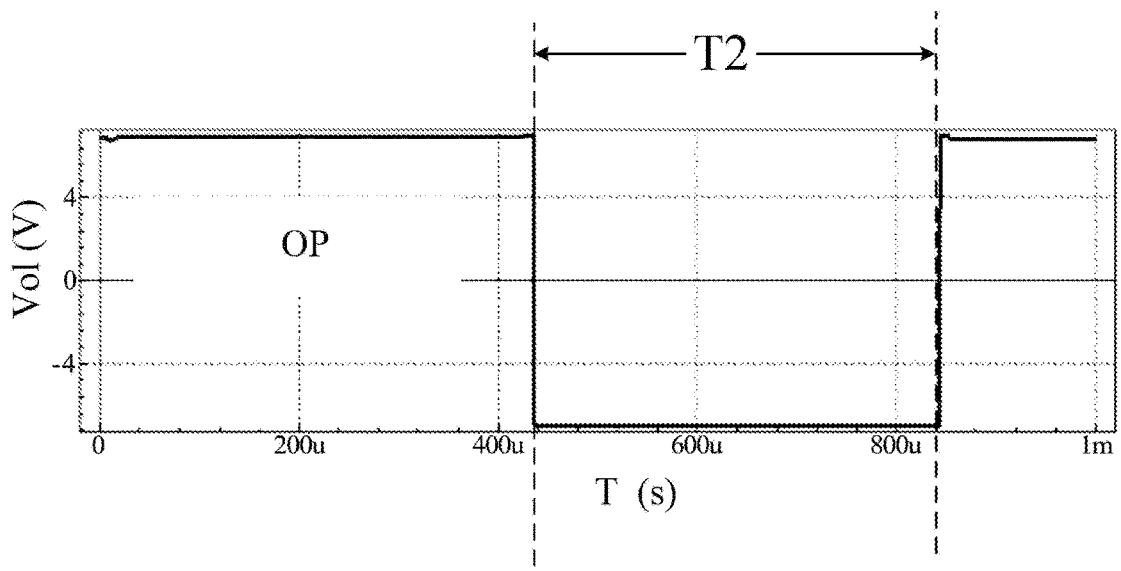
FIG. 9B is a simulation diagram corresponding to the signal output end of the shift register shown in FIG. 9A.
Figure 9C:
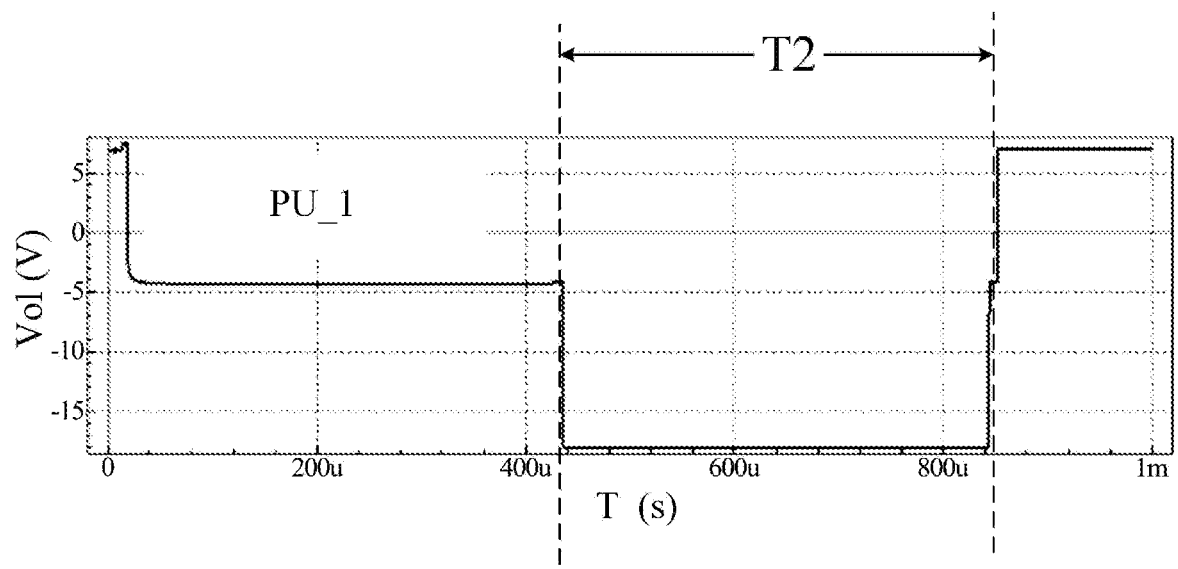
FIG. 9C is a simulation diagram corresponding to a first pull-up node of the shift register shown in FIG. 9A.

During specific implementation, the working process of the shift register shown in FIG. 9A may refer to the working process of the shift register shown in FIG. 7, and will not be repeatedly described here. Furthermore, the signal output by the signal output end OP and the signal of the first pull-up node PU_1 of the shift register shown in FIG. 9A are simulated, as shown in FIG. 9B and FIG. 9C. The X-coordinate represents time, and the Y-coordinate represents voltage. It can be known in combination with FIG. 9A to FIG. 9C, at the output phase T2, the signal output end OP may stably output the signal, thereby avoiding the problem of unsteadiness caused by the leakage of the first pull-up node PU_1.

Figure 10A:
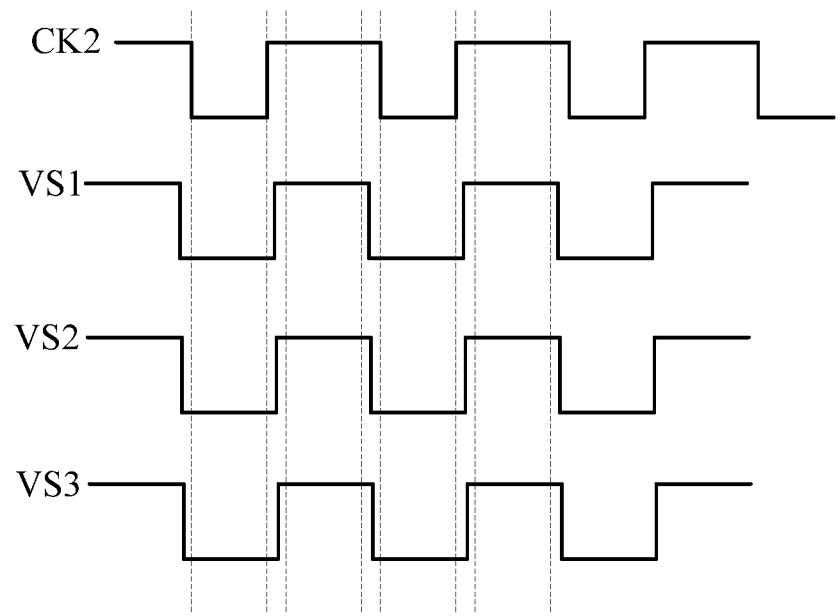
FIG. 10A is a signal time sequence diagram IV provided by the embodiment of the present disclosure.
Figure 10B:
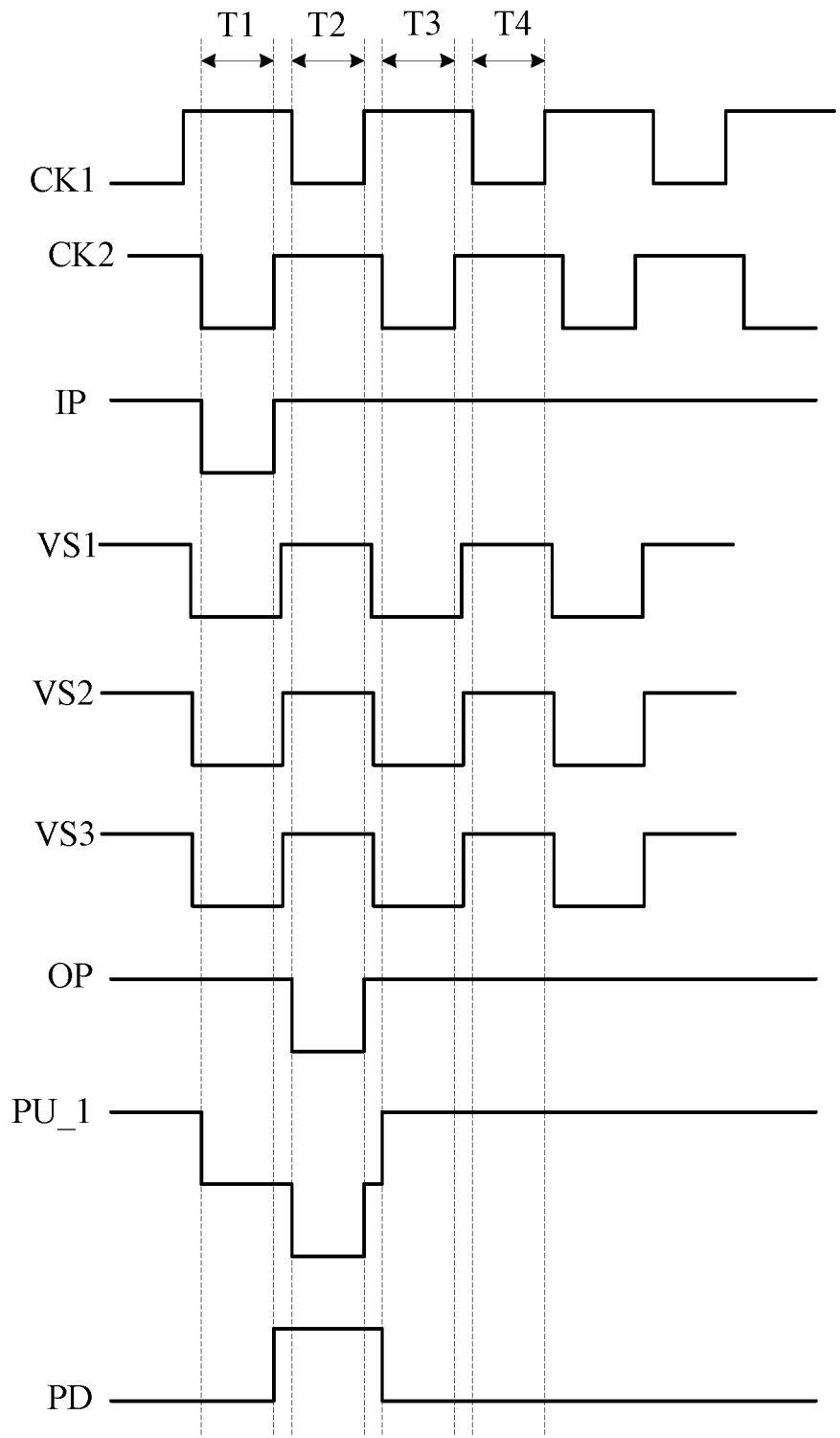
FIG. 10B is a signal time sequence diagram V provided by the embodiment of the present disclosure.

The embodiment of the present disclosure provides signal time sequence diagrams of some shift registers. As shown in FIG. 10A and FIG. 10B, the implementation mode shown in FIG. 8 is transformed. Only differences between the present embodiment and the embodiment of the shift register shown in FIG. 8 are illustrated below, and similarities are omitted here.

In order to reduce the signal lines for signal transmission, during specific implementation, in the embodiment of the present disclosure, as shown in FIG. 10A and FIG. 10B, the first threshold control signal end VS1 may be configured to be a clock signal.

In order to reduce the signal lines for signal transmission, during specific implementation, in the embodiment of the present disclosure, as shown in FIG. 10A and FIG. 10B, the second threshold control signal end VS2 may be configured to be a clock signal.

In order to reduce the signal lines for signal transmission, during specific implementation, in the embodiment of the present disclosure, as shown in FIG. 10A and FIG. 10B, the third threshold control signal end VS3 may be configured to be a clock signal.

Further, in order to reduce the signal lines for signal transmission, during specific implementation, in the embodiment of the present disclosure, as shown in FIG. 10A, the first threshold control signal end VS1 and the second threshold control signal end VS2 may be configured to receive a same signal.

Further, in order to reduce the signal lines for signal transmission, during specific implementation, in the embodiment of the present disclosure, as shown in FIG. 10A, the first threshold control signal end VS1 and the third threshold control signal end VS3 may be configured to receive a same signal.

Further, in order to reduce the signal lines for signal transmission, during specific implementation, in the embodiment of the present disclosure, as shown in FIG. 10A, the first threshold control signal end VS1, the second threshold control signal end VS2, and the third threshold control signal end VS3 may be configured to receive a same signal. In this way, a same signal line may be used to input the clock signal to the first threshold control signal end VS1, the second threshold control signal end VS2, and the third threshold control signal end VS3.

The shift register shown in FIG. 7 is exemplified below to describe the working process of the above-mentioned shift register provided by the embodiment of the present disclosure in combination with the signal time sequence diagrams shown in FIG. 10B. Specifically, an input phase T1, an output phase T2, a reset phase T3 and a reset holding phase T4 in the signal time sequence diagram as shown in FIG. 10B are selected.

At the input phase T1, IP=0, CK1=1, CK2=0, VS1=0, VS2=0, VS3=0. The working process of this phase may refer to the working process of the shift register shown in FIG. 7 at the input phase T1, and will not be repeatedly described here.

After the input phase T1, and before the output phase T2, the working process may also refer to the working process of the shift register shown in FIG. 7 after the input phase T1 and before the output phase T2, and will not be repeatedly described here.

At the output phase T2, IP=1, CK1=0, CK2=1, VS1=1, VS2=1, VS3=1. The working process of this phase may refer to the working process of the shift register shown in FIG. 7 at the output phase T2, and will not be repeatedly described here.

At the reset phase T3, IP=1, CK1=1, CK2=0, VS1=0, VS2=0, VS3=0. Since CK2=0, and VS2=0, the threshold voltage $V_{th2}$ of the second transistor M2 may be enabled to move to right, thereby enabling the second transistor M2 to be completely switched on as much as possible, so as to accelerate a charge process of providing the high-level signal of the input signal end IP to the second pull-up node PU_2 to enable the signal of the second pull-up node PU_2 to be the high-level signal as soon as possible. Since VS1=0, and the first reference signal end VREF1 is the low-level signal, the first transistor M1 may be timely switched on to provide the high-level signal of the second pull-up node PU_2 to the first pull-up node PU_1, so as to control the eighth transistor M8 to be switched off. The rest working process of this phase may refer to the working process of the shift register shown in FIG. 7 at the reset phase T3, and will not be repeatedly described here.

At the reset holding phase T4, IP=1, CK1=0, CK2=1, VS1=1, VS2=1, VS3=1. Although VS3=1 may enable $V_{th4}$ of the fourth transistor M4 to move to left, the gate of the fourth transistor M4 has the voltage of the low-level signal, and the voltage of the source of the fourth transistor M4 is the voltage of the high-level signal, so that the fourth transistor M4 may satisfy $V_{gs4}<V_{th4}$ and be switched on. The rest working process of this phase may refer to the working process of the shift register shown in FIG. 7 at the reset holding phase T4, and will not be repeatedly described here.

After the reset holding phase T4, the working processes of the reset phase T3 and the reset holding phase T4 are repeatedly executed all the time until the level of the signal of the input signal end IP changes to the high level again.

Figure 10C:
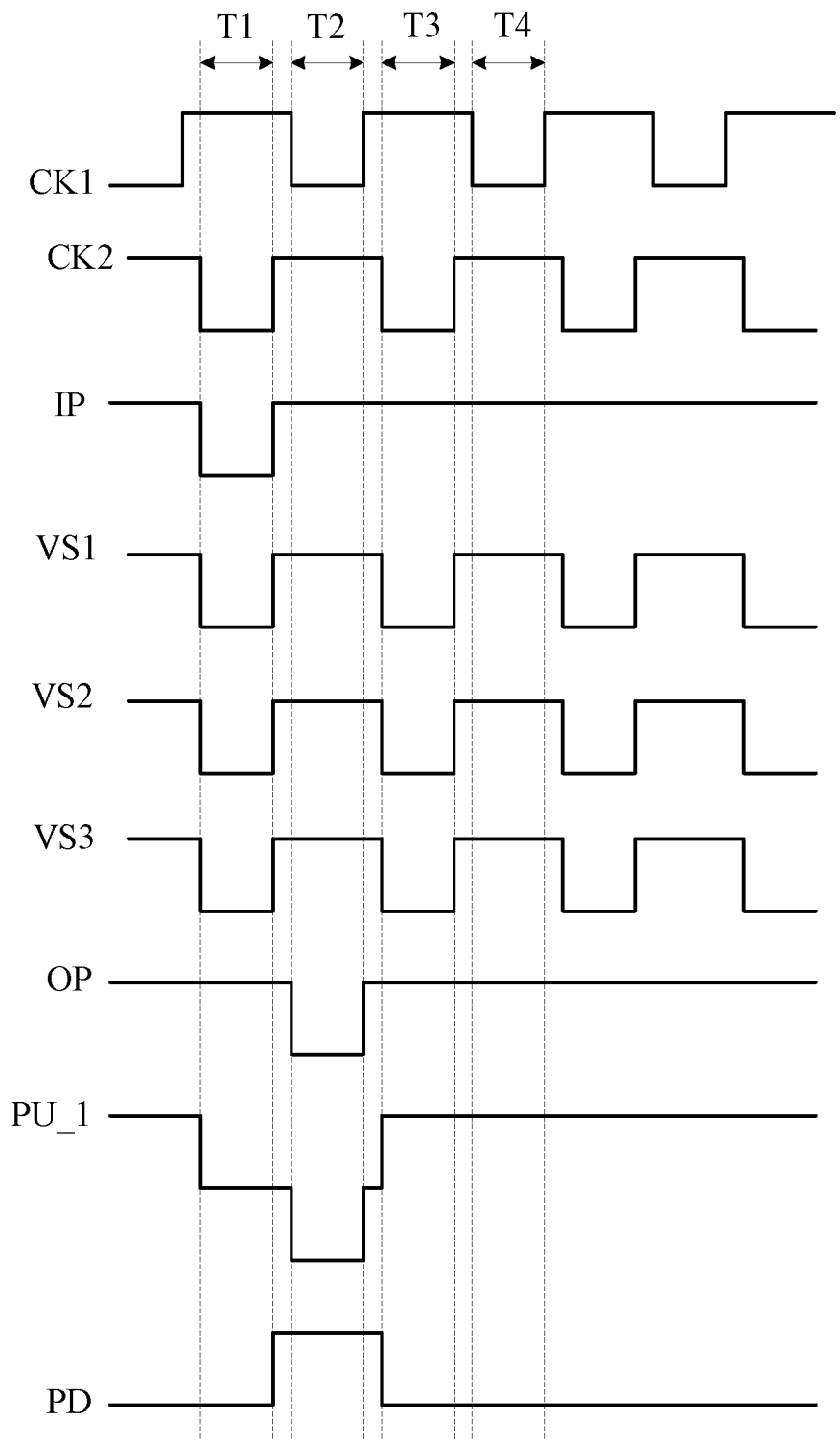
FIG. 10C is a signal time sequence diagram VI provided by the embodiment of the present disclosure.

The embodiment of the present disclosure provides signal time sequence diagrams of some shift registers. As shown in FIG. 10C, the implementation mode shown in FIG. 8 is transformed. Only differences between the present embodiment and the embodiment of the shift register shown in FIG. 8 are illustrated below, and similarities are omitted here.

In order to reduce the computation burden, during specific implementation, in the embodiment of the present disclosure, as shown in FIG. 10C, the first threshold control signal end VS1 may be configured to be a clock signal which is the same as the time sequence of the second clock signal end CK2. In this way, the time sequence of the second clock signal end CK2 may be used to input the clock signal to the first threshold control signal end VS1.

In order to reduce the computation burden, during specific implementation, in the embodiment of the present disclosure, as shown in FIG. 10C, the second threshold control signal end VS2 may be configured to be a clock signal which is the same as the time sequence of the second clock signal end CK2. In this way, the time sequence of the second clock signal end CK2 may be used to input the clock signal to the second threshold control signal end VS2.

In order to reduce the computation burden, during specific implementation, in the embodiment of the present disclosure, as shown in FIG. 10C, the third threshold control signal end VS3 may be configured to be a clock signal which is the same as the time sequence of the second clock signal end CK2. In this way, the time sequence of the second clock signal end CK2 may be used to input the clock signal to the third threshold control signal end VS3.

The working process of the shift register shown in FIG. 8 under the signal time sequence diagram shown in FIG. 10C may refer to the working process of the shift register shown in FIG. 8 under the signal time sequence diagram shown in FIG. 10B, and will not be repeatedly described here.

Figure 11:
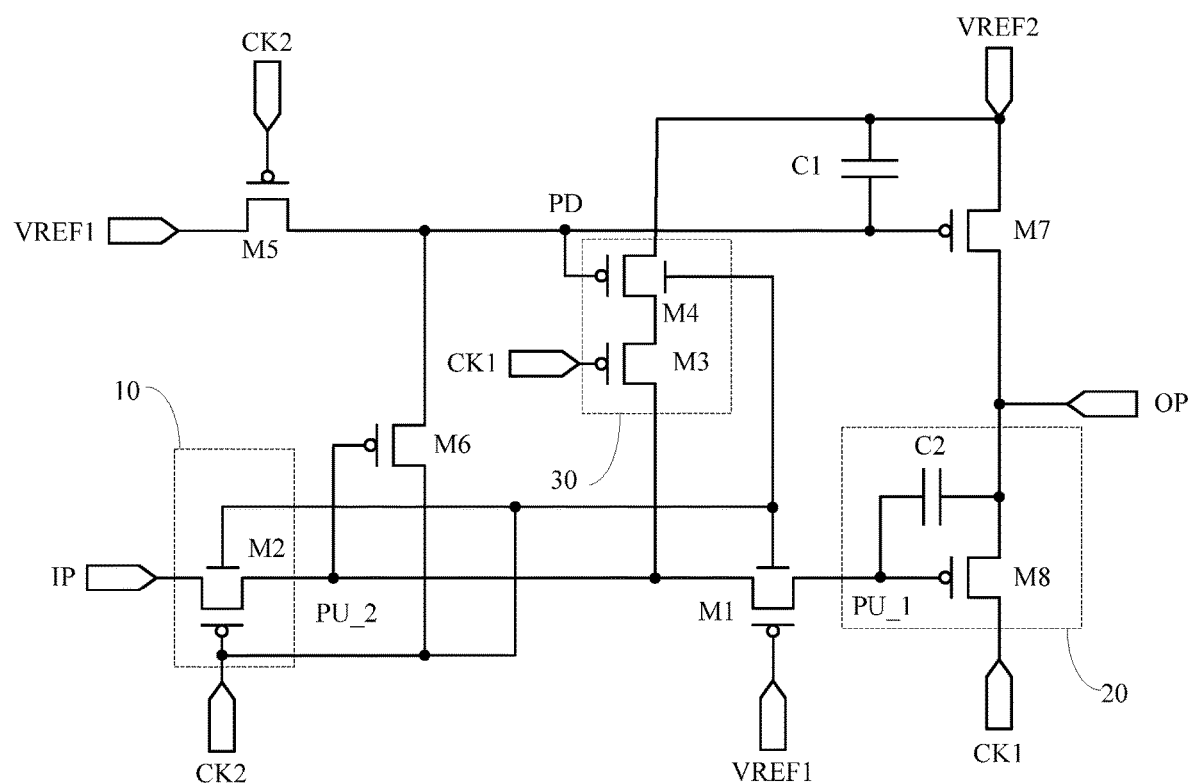
FIG. 11 is a schematic structural diagram V of a shift register provided by the embodiment of the present disclosure.

The embodiment of the present disclosure provides some other shift registers. As shown in FIG. 11, the implementation mode shown in FIG. 7 is transformed. Only differences between the present embodiment and the embodiment of the shift register shown in FIG. 7 are illustrated below, and similarities are omitted here.

Figure 12:
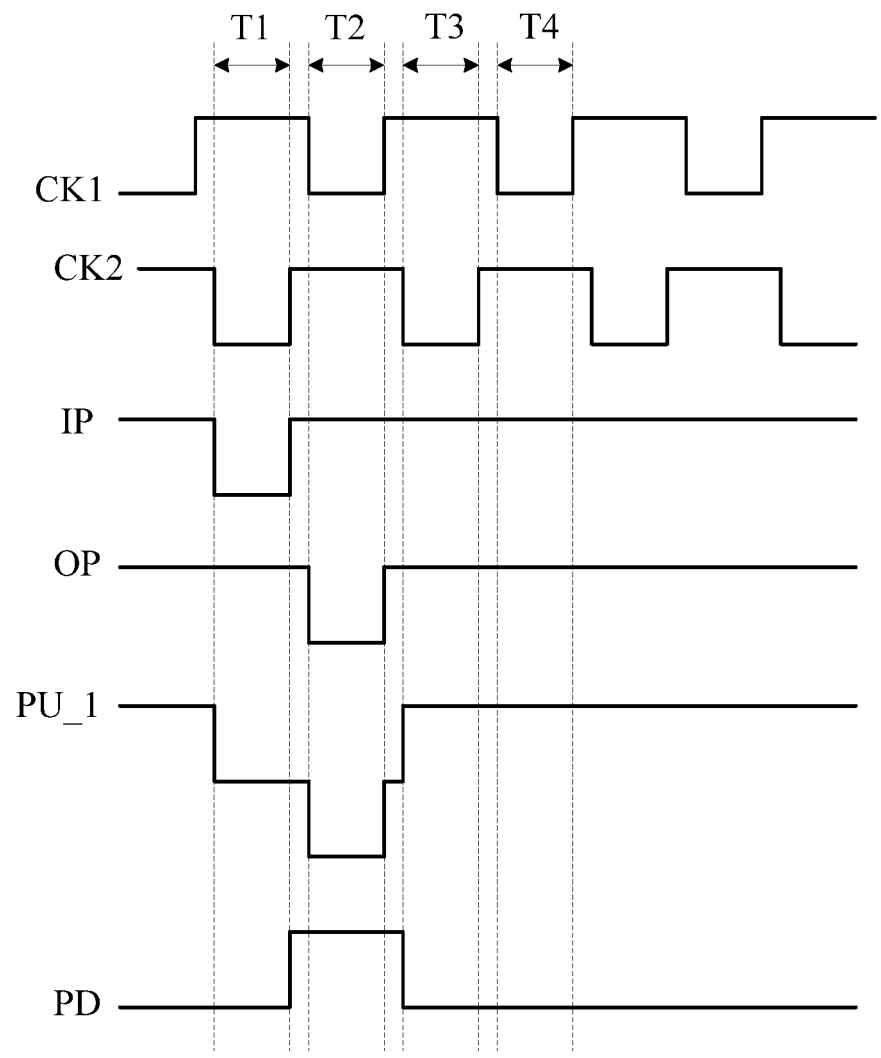
FIG. 12 is a signal time sequence diagram VII provided by the embodiment of the present disclosure.

During specific implementation, in the embodiment of the present disclosure, the first threshold control signal end and the second clock signal end may be set as a same clock signal. As shown in FIG. 11 and FIG. 12, the first threshold control signal end is the second clock signal end CK2. The second gate of the first transistor M1 is coupled to the first gate of the second transistor M2 to enable the second gate of the first transistor M1 to receive the signal of the second clock signal end CK2. In this way, a same signal line may be used to input the signal to the first threshold control signal end and the second clock signal end.

During specific implementation, in the embodiment of the present disclosure, the second threshold control signal end and the second clock signal end may be set as a same clock signal. As shown in FIG. 11 and FIG. 12, the second threshold control signal end is the second clock signal end CK2. The second gate of the second transistor M2 is coupled to the first gate of the second transistor M2 to enable the second gate of the second transistor M2 to receive the signal of the second clock signal end CK2. In this way, a same signal line may be used to input the signal to the first threshold control signal end and the second clock signal end.

During specific implementation, in the embodiment of the present disclosure, the third threshold control signal end and the second clock signal end may be set as a same clock signal. As shown in FIG. 11 and FIG. 12, the second gate of the fourth transistor M4 may be coupled to the gate of the fifth transistor M5. Of course, the second gate of the fourth transistor M4 may also be coupled to the first gate of the second transistor M2, so as to enable the second gate of the fourth transistor M4 to receive the signal of the second clock signal end CK2. In this way, a same signal line may be used to input the signal to the first threshold control signal end and the second clock signal end.

The shift register shown in FIG. 11 is exemplified below to describe the working process of the above-mentioned shift register provided by the embodiment of the present disclosure in combination with the signal time sequence diagram shown in FIG. 12.

At the input phase T1, IP=0, CK1=1, and CK2=0. The working process of this phase may refer to the working process of the shift register shown in FIG. 7 at the input phase T1, and will not be repeatedly described here.

The working process after the input phase T1 and before the output phase T2 may also refer to the working process of the shift register shown in FIG. 7 after the input phase T1 and before the output phase T2, and will not be repeatedly described here.

At the output phase T2, IP=1, CK1=0, and CK2=1. The working process of this phase may refer to the working process of the shift register shown in FIG. 7 at the output phase T2, and will not be repeatedly described here.

At the reset phase T3, IP=1, CK1=1, and CK 2=0. Since CK2=0, the second transistor M2 may be completely switched on as much as possible to timely provide the high-level signal of the input signal end IP to the second pull-up node PU_2 to enable the signal of the second pull-up node PU_2 to be the high-level signal, so as to control the sixth transistor M6 to be switched off. Furthermore, since CK2=0, and the first reference signal end VREF1 is the low-level signal, the first transistor M1 may be timely switched on to provide the high-level signal of the second pull-up node PU_2 to the first pull-up node PU_1 to enable the signal of the first pull-up node PU_1 to be the high-level signal, so as to timely control the eighth transistor M8 to be switched off. The rest working process of this phase may refer to the working process of the shift register shown in FIG. 7 at the reset phase T3, and will not be repeatedly described here.

At the reset holding stage T4, IP=1, CK1=0, and CK2=1. Although CK2=1 may enable $V_{th4}$ of the fourth transistor M4 to move to left, the gate (i.e., the first gate) of the fourth transistor M4 has the voltage of the low-level signal, and the voltage of the source (i.e., the electrode coupled to the second reference signal end VREF2) of the fourth transistor M4 is the voltage of the high-level signal, so that the fourth transistor M4 may satisfy $V_{gs4}<V_{th4}$ and be switched on. The rest working process of this phase may refer to the working process of the shift register shown in FIG. 7 at the reset holding phase T4, and will not be repeatedly described here.

Figure 13:
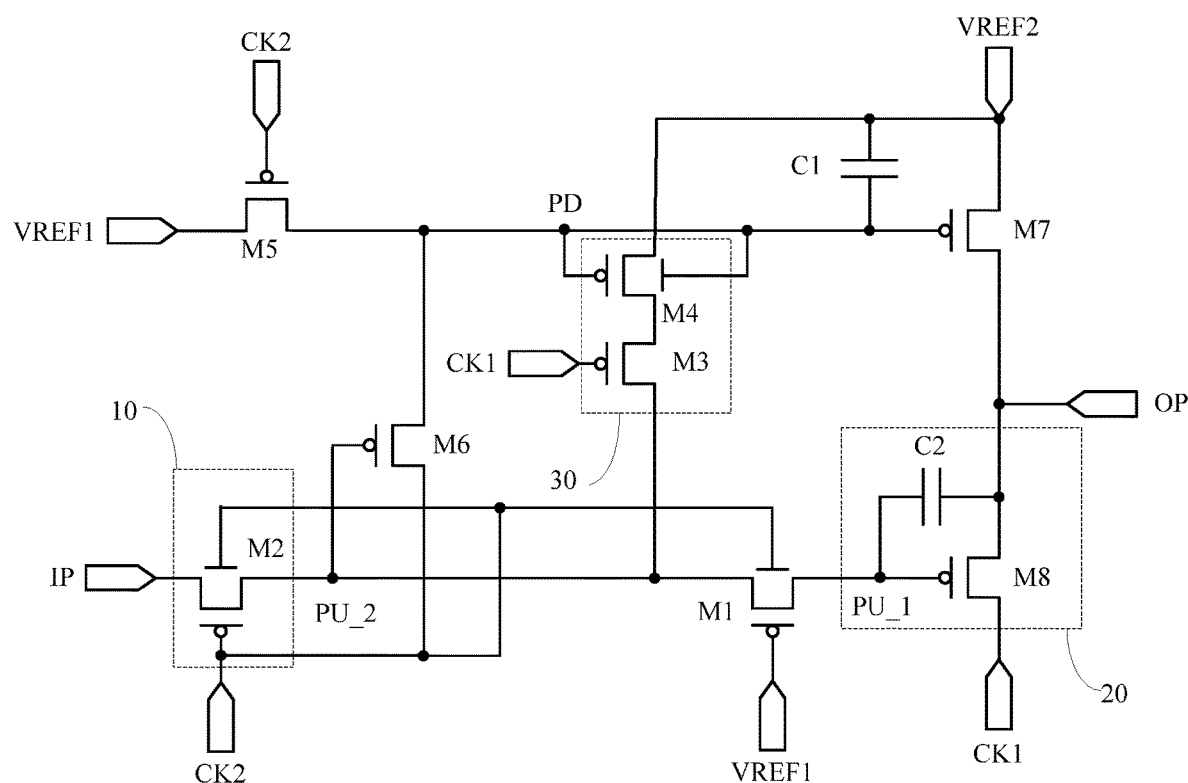
FIG. 13 is a schematic structural diagram VI of a shift register provided by the embodiment of the present disclosure.

The embodiment of the present disclosure provides some other shift registers. As shown in FIG. 13, the implementation mode shown in FIG. 11 is transformed. Only differences between the present embodiment and the embodiment of the shift register shown in FIG. 11 are illustrated below, and similarities are omitted here.

In order to reduce the signal lines for signal transmission, during specific implementation, in the embodiment of the present disclosure, the signal of the third threshold control signal end and the signal of the pull-down node may be a same signal. As shown in FIG. 13, the second gate of the fourth transistor M4 may be coupled to the gate (i.e., the pull-down node PD) of the seventh transistor M7.

The shift register shown in FIG. 13 is exemplified below to describe the working process of the above-mentioned shift register provided by the embodiment of the present disclosure in combination with the signal time sequence diagram shown in FIG. 12.

Specifically, an input phase T1, an output phase T2, a reset phase T3 and a reset holding phase T4 in the signal time sequence diagram as shown in FIG. 12 are selected.

At the input phase T1, IP=0, CK1=1, and CK2=0. The working process of this phase may refer to the working process of the shift register shown in FIG. 7 at the input phase T1, and will not be repeatedly described here.

The working process after the input phase T1 and before the output phase T2 may also refer to the working process of the shift register shown in FIG. 7 after the input phase T1 and before the output phase T2, and will not be repeatedly described here.

At the output phase T2, IP=1, CK1=0, and CK2=1. The working process of this phase may refer to the working process of the shift register shown in FIG. 7 at the output phase T2, and will not be repeatedly described here.

At the reset phase T3, IP=1, CK1=1, and CK 2=0. Since CK2=0, the second transistor M2 may be completely switched on as much as possible to timely provide the high-level signal of the input signal end IP to the second pull-up node PU_2 to enable the signal of the second pull-up node PU_2 to be the high-level signal, so as to control the sixth transistor M6 to be switched off. Furthermore, since CK2=0, and the first reference signal end VREF1 is the low-level signal, the first transistor M1 may be timely switched on to provide the high-level signal of the second pull-up node PU_2 to the first pull-up node PU_1 to enable the signal of the first pull-up node PU_1 to be the high-level signal, so as to timely control the eighth transistor M8 to be switched off. The rest working process of this phase may refer to the working process of the shift register shown in FIG. 7 at the reset phase T3, and will not be repeatedly described here.

At the reset holding phase T4, IP=1, CK1=0, and CK2=1. The working process of this phase may refer to the working process of the shift register shown in FIG. 7 at the reset holding phase T4, and will not be repeatedly described here.

Figure 14A:
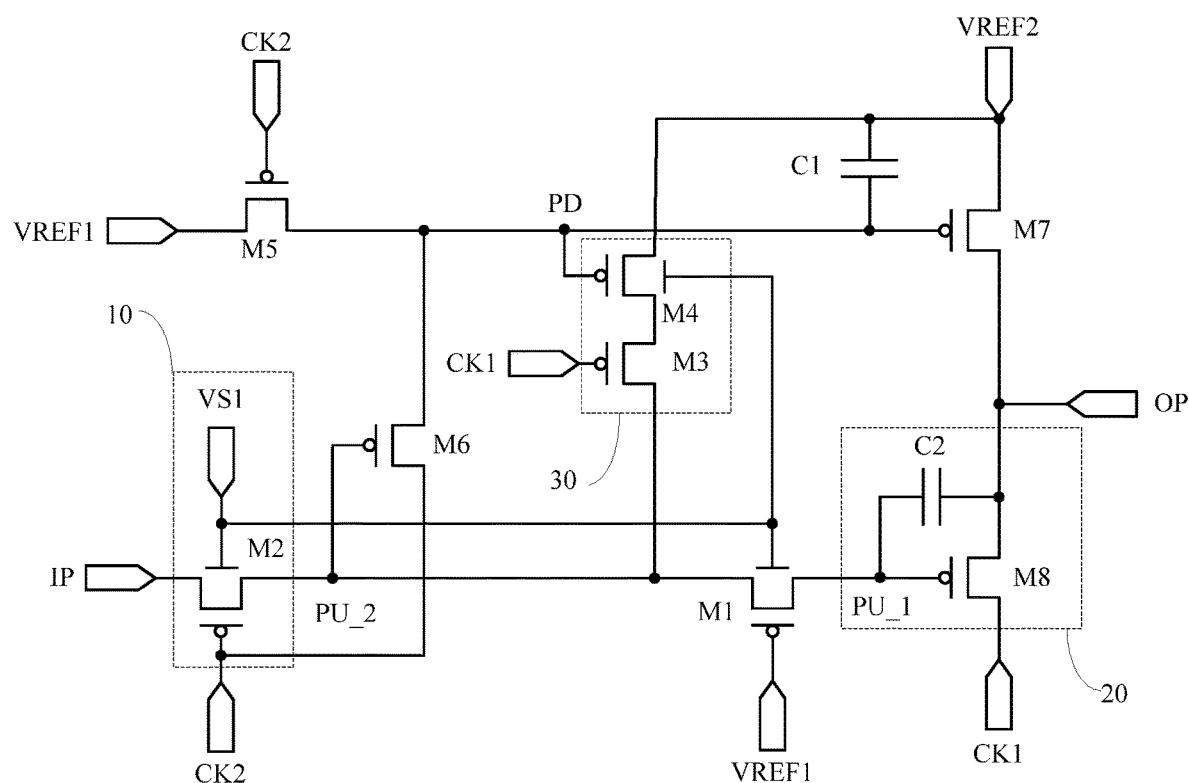
FIG. 14A is a schematic structural diagram VII of a shift register provided by the embodiment of the present disclosure.

The embodiment of the present disclosure provides some other shift registers. As shown in FIG. 14A, the implementation mode of the signal time sequence diagram shown in FIG. 8 is transformed. Only differences between the present embodiment and the signal time sequence diagram shown in FIG. 8 are illustrated below, and similarities are omitted here.

Figure 14B:
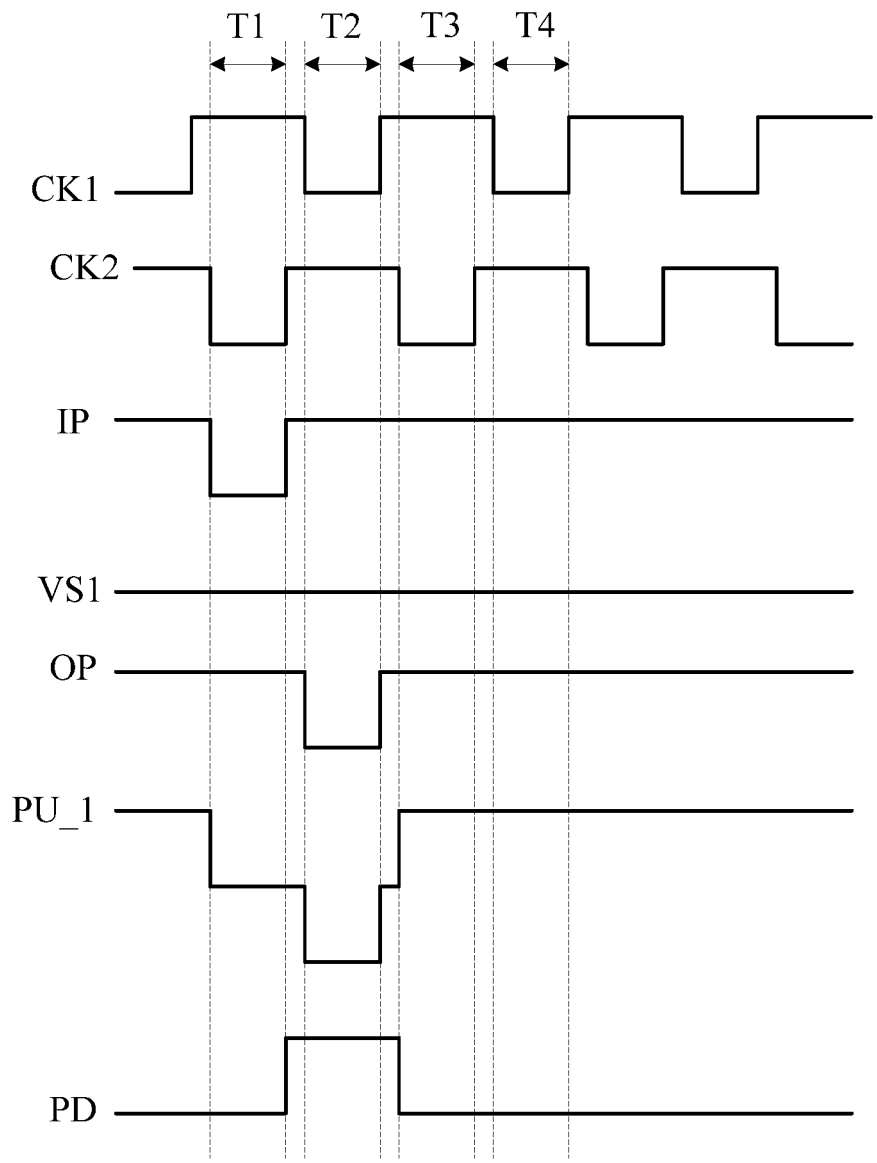
FIG. 14B is a signal time sequence diagram VIII provided by the embodiment of the present disclosure.

During specific implementation, in the embodiment of the present disclosure, as shown in FIG. 14B, the first threshold control signal end VS1 is configured to receive a fixed voltage signal. For example, the first threshold control signal end VS1 is configured to receive a direct current fixed voltage signal having a first voltage value, so as to ensure that the first transistor M1 may be completely switched off as much as possible at the output phase T2 to reduce the leakage influence, caused by leakage current, on the first pull-up node PU_1. Specifically, when the first transistor M1 is the P-type transistor, the first threshold control signal end VS1 may be configured to receive a high-level fixed voltage signal. Further, when the display device uses different refresh frequencies, a first voltage value may be set according to actual application. For example, when the display device uses a relatively low refresh frequency, since the shift register works at a relatively low refresh frequency (such as 1 Hz) or is in a holding state, the first voltage value may be set to be a high voltage, so as to reduce the leakage and ensure the output stability of the shift register. Therefore, the shift register may not work abnormally. Or, when the display device uses a relatively high refresh frequency, since the shift register works at a relatively high refresh frequency (such as 60 Hz and 120 Hz), the first voltage value may be set to be 0 V or a negative voltage to ensure a response speed of the shift register. Of course, the above first voltage value may be designed and determined according to an actual application environment, and is not limited here.

During specific implementation, when the first transistor M1 is the N-type transistor, the first threshold control signal end VS1 may be configured to receive a low-level fixed voltage signal. Further, when the display device uses different refresh frequencies, the first voltage value may be set according to actual applications, and is not limited here.

During specific implementation, in the embodiment of the present disclosure, the second threshold control signal end VS2 is configured to receive a fixed voltage signal. For example, the second threshold control signal end VS2 is configured to receive a direct current fixed voltage signal having a second voltage value, so as to ensure that the second transistor M2 may be completely switched off as much as possible at the output phase T2 to reduce the leakage influence, caused by leakage current, on the second pull-up node PU_2. Specifically, when the second transistor M2 is the P-type transistor, the second threshold control signal end VS2 may be configured to receive a high-level fixed voltage signal. Further, when the display device uses different refresh frequencies, a second voltage value may be set according to actual application. For example, when the display device uses a relatively low refresh frequency, since the shift register works at a relatively low refresh frequency (such as 1 Hz) or is in a holding state, the second voltage value may be set to be a high voltage, so as to reduce the leakage and ensure the output stability of the shift register. Therefore, the shift register may not work abnormally. Or, when the display device uses a relatively high refresh frequency, since the shift register works at a relatively high refresh frequency (such as 60 Hz and 120 Hz), the second voltage value may be set to be 0 V or a negative voltage to ensure a response speed of the shift register. Of course, the above second voltage value may be designed and determined according to an actual application environment, and is not limited here.

During specific implementation, when the second transistor M2 is the N-type transistor, the second threshold control signal end VS2 may be configured to receive a low-level fixed voltage signal. Further, when the display device uses different refresh frequencies, the second voltage value may be set according to actual applications, and is not limited here.

During specific implementation, in the embodiment of the present disclosure, the third threshold control signal end VS3 may also be configured to receive a fixed voltage signal. For example, the third threshold control signal end VS3 is configured to receive a direct current fixed voltage signal having a third voltage value, so as to ensure that the fourth transistor M4 may be completely switched off as much as possible at the output phase T2 to reduce the leakage influence, caused by leakage current, on the second pull-up node PU_2. Specifically, when the fourth transistor M4 is the P-type transistor, the third threshold control signal end VS3 may be configured to receive a high-level fixed voltage signal. Further, when the display device uses different refresh frequencies, a third voltage value may be set according to actual application. For example, when the display device uses a relatively low refresh frequency, since the shift register works at a relatively low refresh frequency (such as 1 Hz) or is in a holding state, the third voltage value may be set to be a high voltage, so as to reduce the leakage and ensure the output stability of the shift register. There-fore, the shift register may not work abnormally. Or, when the display device uses a relatively high refresh frequency, since the shift register works at a relatively high refresh frequency (such as 60 Hz and 120 Hz), the third voltage value may be set to be 0 V or a negative voltage to ensure a response speed of the shift register. Of course, the above third voltage value may be designed and determined according to an actual application environment, and is not limited here.

During specific implementation, when the fourth transistor M4 is the N-type transistor, the third threshold control signal end VS3 may be configured to receive a low-level fixed voltage signal. Further, when the display device uses different refresh frequencies, the third voltage value may be set according to actual applications, and is not limited here.

Further, in order to reduce the signal lines for signal transmission, during specific implementation, in the embodiment of the present disclosure, the second threshold control signal end VS2 and the first threshold control signal end VS1 may be configured to receive a same signal. For example, as shown in FIG. 14A, the second gate of the first transistor M1 and the second gate of the second transistor M2 are coupled to both receive the signal of the first threshold control signal end VS1, so that one signal line is used to input the signal to the second gate of the first transistor M1 and the second gate of the second transistor M2.

Further, in order to reduce the signal lines for signal transmission, during specific implementation, in the embodiment of the present disclosure, the third threshold control signal end VS3 and the first threshold control signal end VS1 may also be configured to receive a same signal. For example, as shown in FIG. 14A, the second gate of the first transistor M1 and the second gate of the fourth transistor M4 are coupled to both receive the signal of the first threshold control signal end VS1, so that one signal line is used to input the signal to the second gate of the first transistor M1 and the second gate of the fourth transistor M4.

Further, during specific implementation, in the embodiment of the present disclosure, the third threshold control signal end VS3, the second threshold control signal end VS2, and the first threshold control signal end VS1 may also be configured to receive a same signal. For example, as shown in FIG. 14A, the second gate of the first transistor M1, the second gate of the second transistor M2, and the second gate of the fourth transistor M4 are coupled to receive the signal of the first threshold control signal end VS1, so that one signal line is used to input the signal to the second gate of the first transistor M1, the second gate of the second transistor M2, and the second gate of the fourth transistor M4.

The shift register shown in FIG. 14A is exemplified below to describe the working process of the above-mentioned shift register provided by the embodiment of the present disclosure in combination with the signal time sequence diagram shown in FIG. 14B.

Specifically, an input phase T1, an output phase T2, a reset phase T3 and a reset holding phase T4 in the signal time sequence diagrams as shown in FIG. 14B are selected.

At the input phase T1, IP=0, CK1=1, CK2=0, and VS1=1. Since CK1=1, the third transistor M3 is switched off. Since CK2=0, the fifth transistor M5 is switched on to provide the low-level signal of the first reference signal end VREF1 to the pull-down node PD to enable the signal of the pull-down node PD to be the low-level signal, so as to control the seventh transistor M7 to be switched on. The switched-on seventh transistor M7 provides the high-level signal of the second reference signal end VREF2 to the signal output end OP to make the signal output end OP to output the high-level signal. Although VS1=1 may enable $V_{th2}$ of the second transistor M2 to move to left, CK2=0, and IP=0, so that the second transistor M2 would still discharge the second pull-up node PU_2 to enable the signal of the second pull-up node PU_2 to be the low-level signal. Although VS1=1 may enable $V_{th1}$ of the first transistor M1 to move to left, the first reference signal VREF is a low-level signal, and the signal of the first pull-up node PU_1 is the high-level signal, so that the first transistor M1 may satisfy $V_{gs1}<V_{th1}$ and be switched on. The working process of this phase may refer to the working process in FIG. 8 at the input phase T1, and will not be repeatedly described here.

The working process after the input phase T1 and before the output phase T2 may also refer to the working process in FIG. 8 after the input phase T1 and before the output phase T2, and will not be repeatedly described here.

At the output phase T2, IP=1, CK1=0, CK2=1, and VS1=1. The working process of this phase may refer to the working process in FIG. 8 at the output phase T2, and will not be repeatedly described here.

At the reset phase T3, IP=1, CK1=1, CK2=0, and VS1=1. The rest working process of this phase may refer to the working process in FIG. 8 at the reset phase T3, and will not be repeatedly described here.

At the reset holding phase T4, IP=1, CK1=0, CK2=1, and VS1=1. Although VS3=1 may enable $V_{th4}$ of the fourth transistor M4 to move to left, the gate of the fourth transistor M4 has the voltage of the low-level signal, and the voltage of the source of the fourth transistor M4 is the voltage of the high-level signal, so that the fourth transistor M4 may satisfy $V_{gs4}<V_{th4}$ and be switched on. The rest working process of this phase may refer to the working process in FIG. 8 at the reset holding phase T4, and will not be repeatedly described here.

Figure 15:
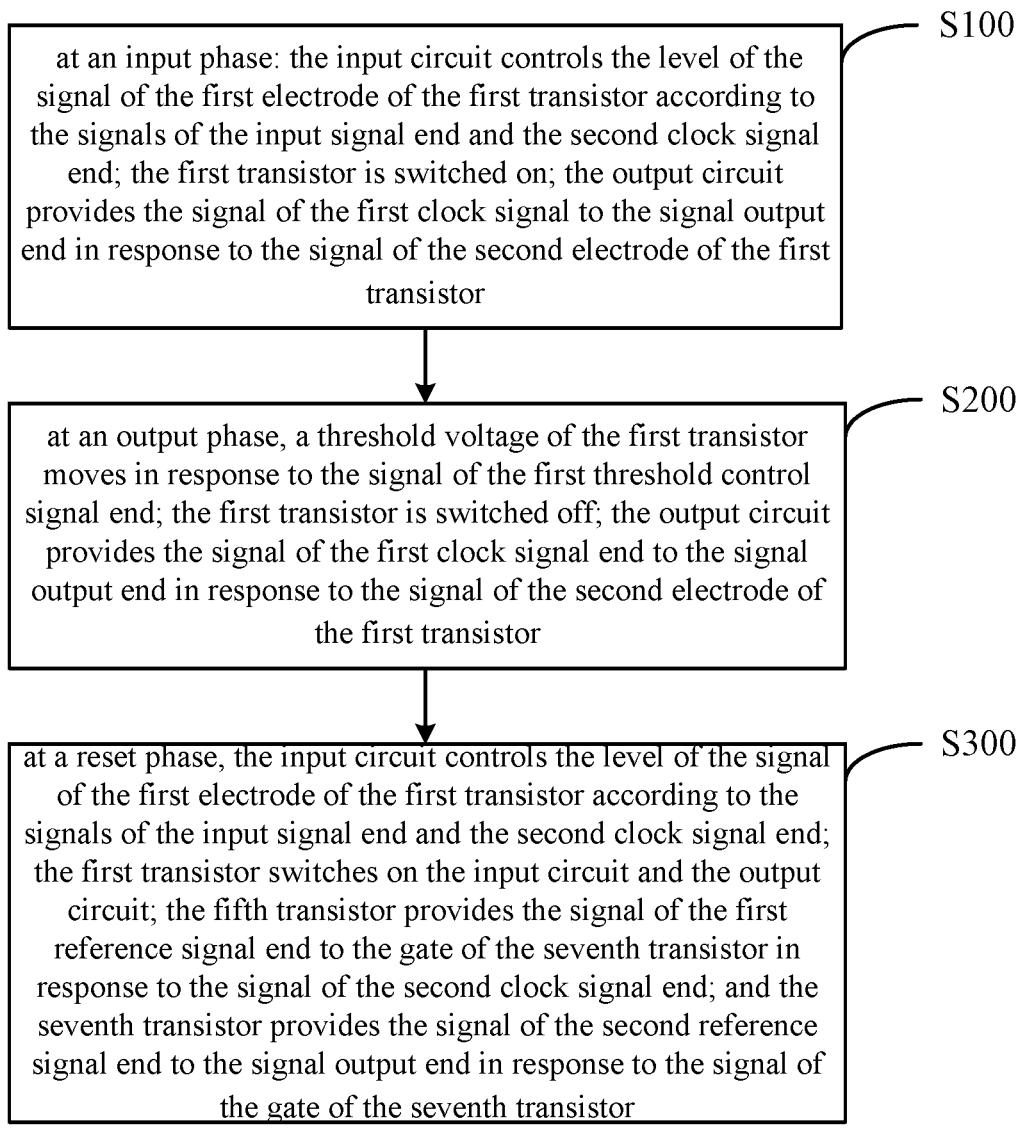
FIG. 15 is a flow diagram of a driving method provided by the embodiment of the present disclosure.

Based on the same inventive concept, the embodiment of the present disclosure further provides a driving method of the above-mentioned shift register. As shown in FIG. 15, the driving method may include the following phases.

S100, at an input phase, the input circuit controls the level of the signal of the first electrode of the first transistor according to the signals of the input signal end and the second clock signal end; the first transistor is switched on; the output circuit provides the signal of the first clock signal to the signal output end in response to the signal of the second electrode of the first transistor.

S200, at an output phase, a threshold voltage of the first transistor moves in response to the signal of the first threshold control signal end; the first transistor is switched off; the output circuit provides the signal of the first clock signal end to the signal output end in response to the signal of the second electrode of the first transistor, where the level of the signal of the first threshold control signal end is opposite to the level of the signal of the first reference signal end.

During specific implementation, in the embodiment of the present disclosure, at the output phase, a threshold voltage of the second transistor moves in response to the signal of the second threshold control signal end, and the second transistor is switched off; and a threshold voltage of the fourth transistor moves in response to the signal of the third threshold control signal end, and the fourth transistor is switched off.

During specific implementation, in the embodiment of the present disclosure, as shown in FIG. 15, the input phase in S100 may further include that: the fifth transistor provides the signal of the first reference signal end to the gate of the seventh transistor in response to the signal of the second clock signal end; the sixth transistor provides the signal of the second clock signal end to the gate of the seventh transistor in response to the signal of the first electrode of the first transistor; and the seventh transistor provides the signal of the second reference signal end to the signal output end in response to the signal of the gate of the seventh transistor.

During specific implementation, in the embodiment of the present disclosure, as shown in FIG. 15, after the output phase in S200, the driving method may further include the following phase.

S300, at a reset phase, the input circuit controls the level of the signal of the first electrode of the first transistor according to the signals of the input signal end and the second clock signal end; the first transistor switches on the input circuit and the output circuit; the fifth transistor provides the signal of the first reference signal end to the gate of the seventh transistor in response to the signal of the second clock signal end; and the seventh transistor provides the signal of the second reference signal end to the signal output end in response to the signal of the gate of the seventh transistor.

During specific implementation, in the embodiment of the present disclosure, after the reset phase in S300, the driving method may further include that: at a reset holding phase, the first capacitor maintains the signal of the gate of the seventh transistor; the seventh transistor provides the signal of the second reference signal end to the signal output end in response to the signal of the gate of the seventh transistor; and the pull-up control circuit provides the signal of the second reference signal end to the second pull-up node in response to the signals of the first clock signal end and the gate of the seventh transistor.

The driving principle and the specific implementation mode of the driving method are the same as the principle and the implementation mode of the shift register of the above embodiment, so that the driving method may be implemented by referring to the specific implementation mode of the shift register in the above embodiment, and will not be repeatedly described.

Figure 16:
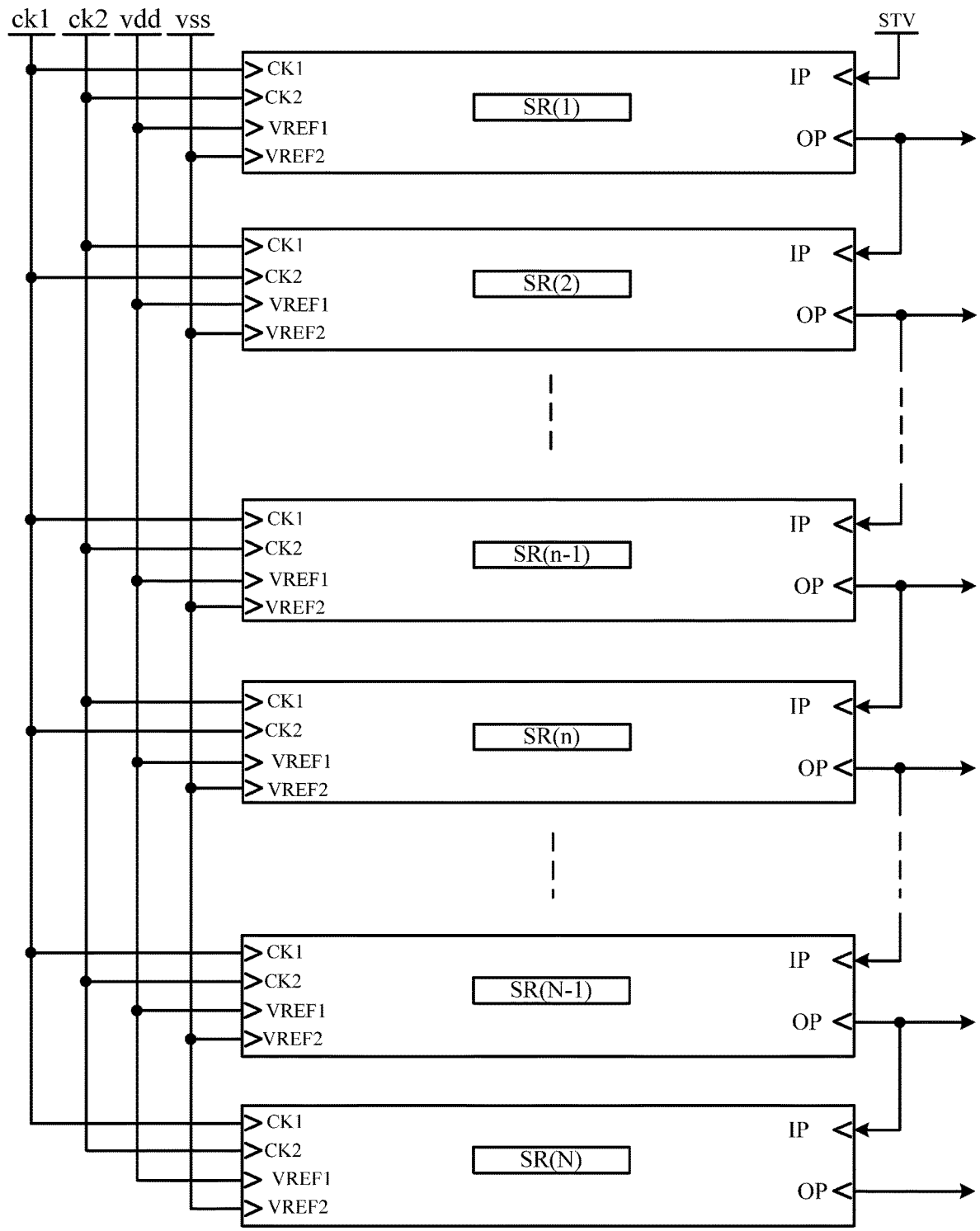
FIG. 16 is a schematic structural diagram of a gate driving circuit provided by the embodiment of the present disclosure.

Based on the same inventive concept, the embodiment of the present disclosure further provides a gate driving circuit. As shown in FIG. 16, the gate driving circuit includes a plurality of the above-mentioned shift registers SR(1), SR(2) . . . SR(n−1), SR(n) . . . SR(N−1), SR(N) (totally N shift registers, 1≤n≤N) that are cascaded. The input signal end IP of the first stage of shift register SR(1) is configured to be coupled to a frame trigger signal end STV.

In every two adjacent shift registers, the input signal end IP of the next stage of shift register SR(n) is configured to be coupled to the signal output end OP of the previous stage of shift register SR(n−1).

Specifically, the specific structure of each shift register in the gate driving circuit is the same as the above shift register of the present disclosure in function and structure, and repeated parts are not described. The gate driving circuit may be set in a liquid crystal display panel, or may be set in an electroluminescence display panel, and is not limited here.

Specifically, in the gate driving circuit provided by the embodiment of the present disclosure, as shown in FIG. 16, the first reference signal ends VREF1 of the various stages of shift registers SR(n) are all coupled to a same direct current signal end vdd, and the second reference signal ends VREF2 of the various stages of shift registers SR(n) are all coupled to a same direct current signal end vss.

Specifically, in the above-mentioned gate driving circuit provided by the embodiment of the present disclosure, as shown in FIG. 16, the first clock signal end CK1 of the (2k−1)th stage of shift register and the second clock signal end CK2 of the 2kth stage of shift register are both coupled to a same clock end, i.e., a first clock end ck1. The second clock signal end CK2 of the (2k−1)th stage of shift register and the first clock signal end CK1 of the 2kth stage of shift register are both coupled to a same clock end, i.e., a second clock end ck2, where k is a positive integer.

Specifically, when the first threshold control signal end is configured to receive the clock signal which is the same as the time sequence of the signal of the second clock signal end, the first threshold control signal end of the (2k−1)th stage of shift register and the first threshold control signal end of the 2kth stage of shift register are both coupled to a same clock end.

Specifically, when the third threshold control signal end is configured to receive the clock signal which is the same as the time sequence of the signal of the second clock signal end, the third threshold control signal end of the (2k−1)th stage of shift register and the third threshold control signal end of the 2kth stage of shift register are both coupled to a same clock end.

Based on the same inventive concept, the embodiment of the present disclosure further provides a display device, including the above-mentioned gate driving circuit provided by the embodiment of the present disclosure. The principle of the display device for solving problems is similar to that of the shift register, so that the implementation of the display device may refer to the implementation of the foregoing shift register, and repeated parts are omitted.

Figure 17:
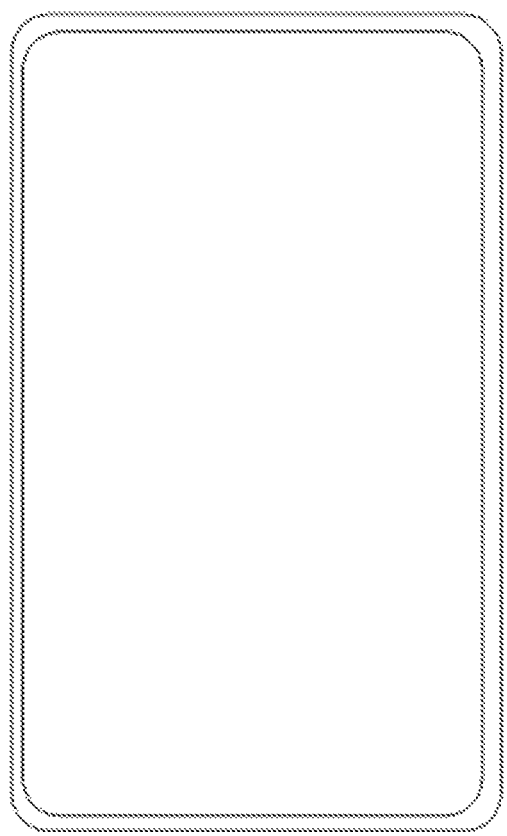
FIG. 17 is a schematic structural diagram of a display device provided by the embodiment of the present disclosure.

During specific implementation, the display device provided by the embodiment of the present disclosure may be a mobile phone as shown in FIG. 17. Of course, the display device provided by the embodiment of the present disclosure may be any product or component having a display function, such as a tablet computer, a television, a display, a notebook computer, a digital photo frame, and a navigator. Other indispensable components of the display device are all understood by those skilled in the art, and are not described herein and should not be construed as limiting the present disclosure.

According to the shift register and the driving method thereof, the gate driving circuit, and the display device, which are provided by the embodiment of the present disclosure, the first transistor is set as the double-gate type transistor. The first gate of the first transistor receives the first reference signal end, and the second gate of the first transistor receives the first threshold control signal end, so that the first transistor may be switched on at the input phase, the reset phase, and the reset holding phase. Furthermore, at least at the output phase, the signal of the first threshold control signal end controls a threshold voltage $V_{th1}$ of the first transistor to enable the threshold voltage $V_{th1}$ of the first transistor to move, so as to enable the first transistor to be switched off as much as possible at the output phase, which may keep the level of the signal of the first pull-up node to be stabilized and avoid the influence of leakage on the signal of the first pull-up node. Therefore, the stability of the signal output by the signal output end is improved. Then, the shift register is favorably applied to the low-frequency driven display device, and is conductive to reducing the power consumption.

Obviously, those skilled in the art can make various changes and modifications to the embodiments of the present disclosure without departing from the spirits and scopes of the embodiments of the present disclosure. Therefore, if these changes and modifications of the present disclosure fall within the scope of the claims of the present disclosure and equivalent technologies of the present disclosure, the present disclosure is intended to include these changes and modifications.

The invention claimed is:

1. A shift register, comprising:
   an input circuit, configured to be coupled to an input signal end and a second clock signal end, respectively;
   a first transistor, wherein a first electrode of the first transistor is coupled to an output end of the input circuit, and the first transistor is a double-gate type transistor;
   a first gate of the first transistor is configured to be coupled to a first reference signal end, and a second gate of the first transistor is configured to be coupled to a first threshold control signal end; and
   an output circuit, configured to be coupled to a first clock signal end and a signal output end, respectively, wherein a control end of the output circuit is coupled to a second electrode of the first transistor wherein the input circuit comprises:
   a single-gate type second transistor;
   a gate of the second transistor is configured to be coupled to the second clock signal end;
   a first electrode of the second transistor is configured to be coupled to the input signal end; and
   a second electrode of the second transistor is coupled to the first electrode of the first transistor; wherein
   the second gate of the first transistor is coupled to the first electrode of the second transistor.

2. The shift register according to claim 1, wherein the shift register further comprises: a fifth transistor, a sixth transistor, a seventh transistor, and a first capacitor;
   a gate of the fifth transistor is configured to be coupled to the second clock signal end; a first electrode of the fifth transistor is configured to be coupled to the first reference signal end; a second electrode of the fifth transistor is coupled to a gate of the seventh transistor;
   a gate of the sixth transistor is configured to be coupled to the first electrode of the first transistor; a first electrode of the sixth transistor is configured to be coupled to the second clock signal end; a second electrode of the sixth transistor is coupled to the gate of the seventh transistor;
   a first electrode of the seventh transistor is configured to be coupled to a second reference signal end, and a second electrode of the seventh transistor is coupled to the signal output end; and
   a first end of the first capacitor is coupled to the gate of the seventh transistor, and a second end of the first capacitor is configured to be coupled to the second reference signal end.

3. The shift register according to claim 2, wherein the shift register further comprises: a pull-up control circuit; a first control end of the pull-up control circuit is configured to be coupled to the first clock signal end; a second control end of the pull-up control circuit is coupled to the gate of the seventh transistor; an input end of the pull-up control circuit is configured to be coupled to the second reference signal end; and an output end of the pull-up control circuit is coupled to the first electrode of the first transistor.

4. The shift register according to claim 3, wherein the pull-up control circuit comprises: a third transistor and a single-gate fourth transistor;

a gate of the third transistor is configured to be coupled to the first clock signal end; a first electrode of the third transistor is coupled to the first electrode of the first transistor; a second electrode of the third transistor is coupled to a first electrode of the fourth transistor; and a gate of the fourth transistor is coupled to the gate of the seventh transistor, and a second electrode of the fourth transistor is configured to be coupled to the second reference signal end.

5. The shift register according to claim 3, wherein the pull-up control circuit comprises: a third transistor and a double-gate fourth transistor;

a gate of the third transistor is configured to be coupled to the first clock signal end; a first electrode of the third transistor is coupled to the first electrode of the first transistor; a second electrode of the third transistor is coupled to a first electrode of the fourth transistor; and a first gate of the fourth transistor is coupled to the gate of the seventh transistor; a second gate of the fourth transistor is configured to be coupled to a third threshold control signal end; and a second electrode of the fourth transistor is configured to be coupled to the second reference signal end.

6. The shift register according to claim 5, wherein the second gate of the fourth transistor is coupled to the gate of the seventh transistor; or, the second gate of the fourth transistor is coupled to the gate of the fifth transistor.

7. The shift register according to claim 5, wherein the first threshold control signal end is configured to receive a signal at least having a level opposite to a level of a signal of the first reference signal end;

a second threshold control signal end is configured to receive the signal at least having a level opposite to a level of the signal of the first reference signal end; and the third threshold control signal end is configured to receive the signal at least having a level opposite to a level of the signal of the first reference signal end.

8. The shift register according to claim 7, wherein at least one of the first threshold control signal end, the second threshold control signal end, and the third threshold control signal end is configured to receive a clock signal which is the same as a time sequence of the second clock signal end.

9. The shift register according to claim 7, wherein at least one of the first threshold control signal end, the second threshold control signal end, and the third threshold control signal end is configured to receive a fixed voltage signal.

10. The shift register according to claim 1, wherein the output circuit comprises: an eighth transistor and a second capacitor;

a gate of the eighth transistor is configured to be coupled to the second electrode of the first transistor; a first electrode of the eighth transistor is configured to be coupled to the first clock signal end; a second electrode of the eighth transistor is coupled to the signal output end; and a first end of the second capacitor is coupled to the second electrode of the first transistor, and a second end of the second capacitor is configured to be coupled to the signal output end.

11. A gate driving circuit, comprising a plurality of cascaded shift registers according to claim 1, wherein an input signal terminal of a first stage of shift register is configured to be coupled to a frame trigger signal end; and in every two adjacent shift registers, an input signal end of a next stage of shift register is configured to be coupled to a signal output end of a previous stage of shift register.

12. A display device, comprising the gate driving circuit according to claim 11.

13. A driving method of the shift register according to claim 1, comprising:

at an input phase, controlling, by the input circuit, a level of a signal of the first electrode of the first transistor according to signals of the input signal end and the second clock signal end, switching on the first transistor, and providing, by the output circuit in response to a signal of the second electrode of the first transistor, a signal of the first clock signal end to the signal output end; and at an output phase, enabling a threshold voltage of the first transistor to move in response to a signal of the first threshold control signal end, switching off the first transistor, and providing, by the output circuit in response to the signal of the second electrode of the first transistor, the signal of the first clock signal end to the signal output end, wherein a level of a signal of the first threshold control signal end is opposite to a level of a signal of the first reference signal end.

14. The driving method according to claim 13, wherein the input phase further comprises: providing, by the fifth transistor in response to the signal of the second clock signal end, the signal of the first reference signal end to a gate of a seventh transistor; providing, by a sixth transistor in response to the signal of the first electrode of the first transistor, the signal of the second clock signal end to the gate of the seventh transistor; and providing, by the seventh transistor in response to a signal of the gate of the seventh transistor, the signal of a second reference signal end to the signal output end;

after the output phase, the driving method further comprises:

at a reset phase, controlling, by the input circuit, the level of the signal of the first electrode of the first transistor according to the signals of the input signal end and the second clock signal end; switching on, by the first transistor, the input circuit and the output circuit; providing, by a fifth transistor in response to the signal of the second clock signal end, the signal of the first reference signal end to the gate of the seventh transistor; and providing, by the seventh transistor in response to the signal of the gate of the seventh transistor, the signal of the second reference signal end to the signal output end.

15. The driving method according to claim 13, wherein at the output phase, a threshold voltage of the second transistor moves in response to a signal of a second threshold control signal end, and the second transistor is switched off; and a threshold voltage of a fourth transistor moves in response to a signal of a third threshold control signal end, and the fourth transistor is switched off.

* * * * *